United States Patent
Jang et al.

(10) Patent No.: US 12,336,287 B2
(45) Date of Patent: Jun. 17, 2025

(54) DISPLAY DEVICE AND TILED DISPLAY DEVICE INCLUDING THE SAME

(71) Applicant: Samsung Display Co., LTD., Yongin-si (KR)

(72) Inventors: Dae Hwan Jang, Seoul (KR); Yi Joon Ahn, Seoul (KR); Jae Been Lee, Seoul (KR); Jin Ho Cho, Cheonan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 267 days.

(21) Appl. No.: 17/393,940

(22) Filed: Aug. 4, 2021

(65) Prior Publication Data
US 2022/0052079 A1   Feb. 17, 2022

(30) Foreign Application Priority Data

Aug. 14, 2020   (KR) .................. 10-2020-0102526

(51) Int. Cl.
*H10D 86/60* (2025.01)
*H01L 25/16* (2023.01)
(Continued)

(52) U.S. Cl.
CPC .......... *H10D 86/60* (2025.01); *H01L 25/162* (2013.01); *H01L 25/167* (2013.01); *H01L 25/18* (2013.01);
(Continued)

(58) Field of Classification Search
CPC .. H10D 86/60; H10D 86/0212; H10D 86/441; H10D 86/451; H01L 25/162;
(Continued)

(56) References Cited

U.S. PATENT DOCUMENTS 9,214,507 B2 * 12/2015 Mathew ................ H05B 45/60
10,211,233 B2    2/2019 Kawata et al.
(Continued)

FOREIGN PATENT DOCUMENTS

EP    3 343 273      7/2018
JP     6527194       6/2019
(Continued)

OTHER PUBLICATIONS

Extended European search report for European Patent Application or Patent No. 21190686.2 dated Jan. 11, 2022.

*Primary Examiner* — Yasser A Abdelaziz
(74) *Attorney, Agent, or Firm* — KILE PARK REED & HOUTTEMAN PLLC

(57) ABSTRACT

A display device includes a substrate including a first contact hole, an etching stopper disposed on a surface of the substrate and including the first contact hole, a metal pattern disposed on another surface opposite to the surface of the substrate and surrounding the first contact hole in a plan view, a first pad unit overlapping a part of the metal pattern and inserted into the first contact hole, a lead line disposed on the another surface of the substrate and electrically connected to another part of the metal pattern, a second pad unit disposed on the another surface of the substrate and electrically connected to the lead line, a protective film overlapping the another surface of the substrate and the lead line, and a protection part overlapping the first pad unit.

24 Claims, 17 Drawing Sheets

(51) Int. Cl.
*H01L 25/18* (2023.01)
*H10D 86/01* (2025.01)
*H10D 86/40* (2025.01)
*G09G 3/3275* (2016.01)

(52) U.S. Cl.
CPC ....... *H10D 86/0212* (2025.01); *H10D 86/441* (2025.01); *G09G 3/3275* (2013.01); *G09G 2300/026* (2013.01)

(58) Field of Classification Search
CPC ... H01L 25/167; H01L 25/18; H01L 25/0753; G09G 3/3275; G09G 2300/026; G09F 9/3026; G09F 9/33; H10H 29/142
See application file for complete search history.

(56) References Cited

U.S. PATENT DOCUMENTS

| | | |
|---|---|---|
| 2005/0215054 A1 | 9/2005 | Rasmussen et al. |
| 2009/0294046 A1* | 12/2009 | Sim ........................ H05K 3/323 |
| | | 977/773 |
| 2014/0168032 A1* | 6/2014 | Swan ........................ G09G 3/20 |
| | | 361/679.01 |
| 2016/0013442 A1* | 1/2016 | Akimoto .............. H10K 50/844 |
| | | 257/40 |
| 2017/0179159 A1* | 6/2017 | Kawata ............... G02F 1/13452 |
| 2018/0196300 A1* | 7/2018 | Jung .................... G02B 6/0001 |
| 2018/0342707 A1* | 11/2018 | Lee ....................... H10K 77/111 |
| 2019/0324567 A1* | 10/2019 | Hong .................... H10K 50/86 |
| 2019/0326269 A1 | 10/2019 | Schwarz |
| 2020/0203462 A1 | 6/2020 | Oh |

FOREIGN PATENT DOCUMENTS

| | | |
|---|---|---|
| KR | 10-2006-0072737 | 6/2006 |
| KR | 10-2020-0031468 | 3/2020 |

* cited by examiner

EL: AE, ED, CE

DISPLAY DEVICE AND TILED DISPLAY DEVICE INCLUDING THE SAME

CROSS-REFERENCE TO RELATED APPLICATION(S)

This application claims priority to and benefits of Korean Patent Application No. 10-2020-0102526 under 35 U.S.C. § 119 filed on Aug. 14, 2020, in the Korean Intellectual Property Office, the entire contents of which are incorporated herein by reference.

BACKGROUND

1. Technical Field

The disclosure relates to a display device and a tiled display device including the same.

2. Description of the Related Art

With the continued advance of an information-oriented society, more and more demands are placed on display devices for displaying images in various ways. For example, display devices are employed in various electronic devices such as smartphones, digital cameras, laptop computers, navigation devices, and smart televisions. The display device may be a flat panel display device such as a liquid crystal display device, a field emission display device and an organic light emitting display device. Among the flat panel display devices, in the light emitting display device, since each of pixels of a display panel may include a light emitting element emitting light by itself, an image may be displayed without a backlight unit providing light to the display panel.

In a case that the display device is manufactured in a large size, a defect rate of the light emitting element may increase due to an increase in the number of pixels, thereby deteriorating productivity or reliability of the display device. To solve this problem, in a tiled display device, a large-sized screen may be implemented by connecting a plurality of display devices having a relatively small size. The tiled display device may include a boundary portion called a seam between the plurality of display devices, due to a non-display area or a bezel area of each of the plurality of display devices adjacent to each other. In a case that a single image is displayed on the entire screen, the boundary portion between the plurality of display devices may give a sense or an impression of disconnection over the entire screen, thereby reducing a sense of immersion in the image.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Aspects of the disclosure provide a tiled display device that removes a sense of disconnection between a plurality of display devices and improving a sense of immersion in an image, by preventing the recognition of boundary portions or non-display areas between the plurality of display devices.

However, aspects of the disclosure are not restricted to the ones set forth herein. The above and other aspects of the disclosure will become more apparent to one of ordinary skill in the art to which the disclosure pertains by referencing the detailed description of the disclosure given below.

According to an embodiment, a display device may include a substrate including a first contact hole; an etching stopper disposed on a surface of the substrate and including the first contact hole; a metal pattern disposed on another surface opposite to the surface of the substrate and surrounding the first contact hole in a plan view; a first pad unit overlapping a part of the metal pattern and inserted into the first contact hole; a lead line disposed on the another surface of the substrate and electrically connected to another part of the metal pattern; a second pad unit disposed on the another surface of the substrate and electrically connected to the lead line; a protective film overlapping the another surface of the substrate and the lead line; and a protection part overlapping the first pad unit.

The display device may further comprise a flexible film disposed on the second pad unit; and a source driver that supplies a source voltage to the first pad unit, the source driver being disposed on the flexible film.

The metal pattern may include a metal oxide having a wet etching resistance, and a wet etching rate of the metal pattern may be lower than a wet etching rate of the substrate.

The etching stopper may include an inorganic insulating material or an organic insulating material having a wet etching resistance, and a wet etching rate of the etching stopper may be lower than a wet etching rate of the substrate.

The first pad unit may be formed through a coating process using a metal ink and a heat treatment process.

The protection part may be disposed in a recess of the first pad unit formed by the first contact hole.

The display device may further comprise a display area including a plurality of pixels; and a non-display area adjacent to the display area. The first pad unit may be disposed in the display area, and the second pad unit may be disposed in the non-display area.

The display device may further comprise a display area including a plurality of pixels; and a non-display area adjacent to the display area. The first pad unit and the second pad unit may be disposed in the display area.

The display device may further comprise a thin film transistor layer disposed on the etching stopper, the thin film transistor layer comprising a plurality of insulating layers and a thin film transistor; and a connection line electrically connected to the first pad unit through a second contact hole connected to the first contact hole, the connection line being disposed on a part of the plurality of insulating layers of the thin film transistor layer.

The plurality of insulating layers of the thin film transistor layer may comprise a gate insulating layer disposed on the etching stopper; an interlayer insulating layer disposed on the gate insulating layer; and a passivation layer disposed on the interlayer insulating layer. The connection line may be disposed on the interlayer insulating layer, and the second contact hole may pass through the interlayer insulating layer and the gate insulating layer.

The thin film transistor layer may comprise a data line electrically connected to the thin film transistor, and the connection line may supply a data voltage to the data line and may be electrically connected to the data line.

The thin film transistor layer may comprise a gate line electrically connected to the thin film transistor, and the connection line may supply a gate signal to the gate line and may be electrically connected to the gate line.

The display device may further comprise a plurality of display areas each including a plurality of pixels; and a non-display area adjacent to the plurality of display areas. The substrate may include a plurality of first contact holes, and the plurality of first contact holes may be disposed along an extension line from an upper end of a side of each of the plurality of display areas to a lower end of another side of each of the plurality of display areas.

The display device may further comprise a plurality of display areas each including a plurality of pixels; and a non-display area adjacent to the plurality of display areas. The substrate may include a plurality of first contact holes, the second pad unit may be disposed on a part of each of the plurality of display areas, and the plurality of first contact holes may be disposed along an extension line from an upper end of a side of each of the plurality of display areas to a second pad unit disposed on another side of each of the plurality of display areas.

The display device may further comprise a plurality of display areas each including a plurality of pixels; and a non-display area adjacent to the plurality of display areas. The substrate may include a plurality of first contact holes, the second pad unit may be disposed on a part of each of the plurality of display areas, a number of the plurality of first contact holes may be disposed along an extension line from an upper end of a side of each of the plurality of display areas to a second pad unit disposed on another side of each of the plurality of display areas, and a number of other first contact holes may be disposed along an extension line from an upper end of the another side of each of the plurality of display areas to a second pad unit disposed on a side of each of the plurality of display areas.

According to an embodiment, a tiled display device may include a plurality of display devices, each of the plurality of display devices including a display area having a plurality of pixels; and a non-display area adjacent to the display area; and a coupling member that connects the plurality of display devices. Each of the plurality of display devices may comprise a substrate including a first contact hole; an etching stopper disposed on a surface of the substrate and including the first contact hole; a metal pattern disposed on another surface opposite to the surface of the substrate and surrounding the first contact hole in a plan view; a first pad unit overlapping a part of the metal pattern and inserted into the first contact hole; a protective film overlapping the another surface of the substrate; and a protection part overlapping the first pad unit.

Each of the plurality of display devices may further comprise a lead line disposed on the another surface of the substrate and electrically connected to another part of the metal pattern; and a second pad unit disposed on the another surface of the substrate and electrically connected to the lead line.

The metal pattern may include a metal oxide having a wet etching resistance, and a wet etching rate of the metal pattern may be lower than a wet etching rate of the substrate.

The first pad unit may be formed through a coating process using a metal ink and a heat treatment process.

The protection part may be disposed in a recess of the first pad unit formed by the first contact hole.

In accordance with the display device and the tiled display device including the same according to embodiments, it may include a metal pattern disposed on a bottom surface of a substrate to surround a contact hole of the substrate and having wet etching resistance, so that it may serve as a mask in an etching process of providing a contact hole of the substrate, and it may include a protective film covering the bottom surface of the substrate, thereby protecting a wiring on the bottom surface of the substrate in an etching process of providing a contact hole of the substrate. Accordingly, in the display device and the tiled display device including the same, it may include a pad unit provided or disposed on the bottom surface of the substrate, thereby minimizing a gap between a plurality of display devices, and preventing a user from recognizing a boundary portion or a non-display area between the plurality of display devices.

The effects of the disclosure are not limited to the aforementioned effects, and various other effects are included in the specification.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
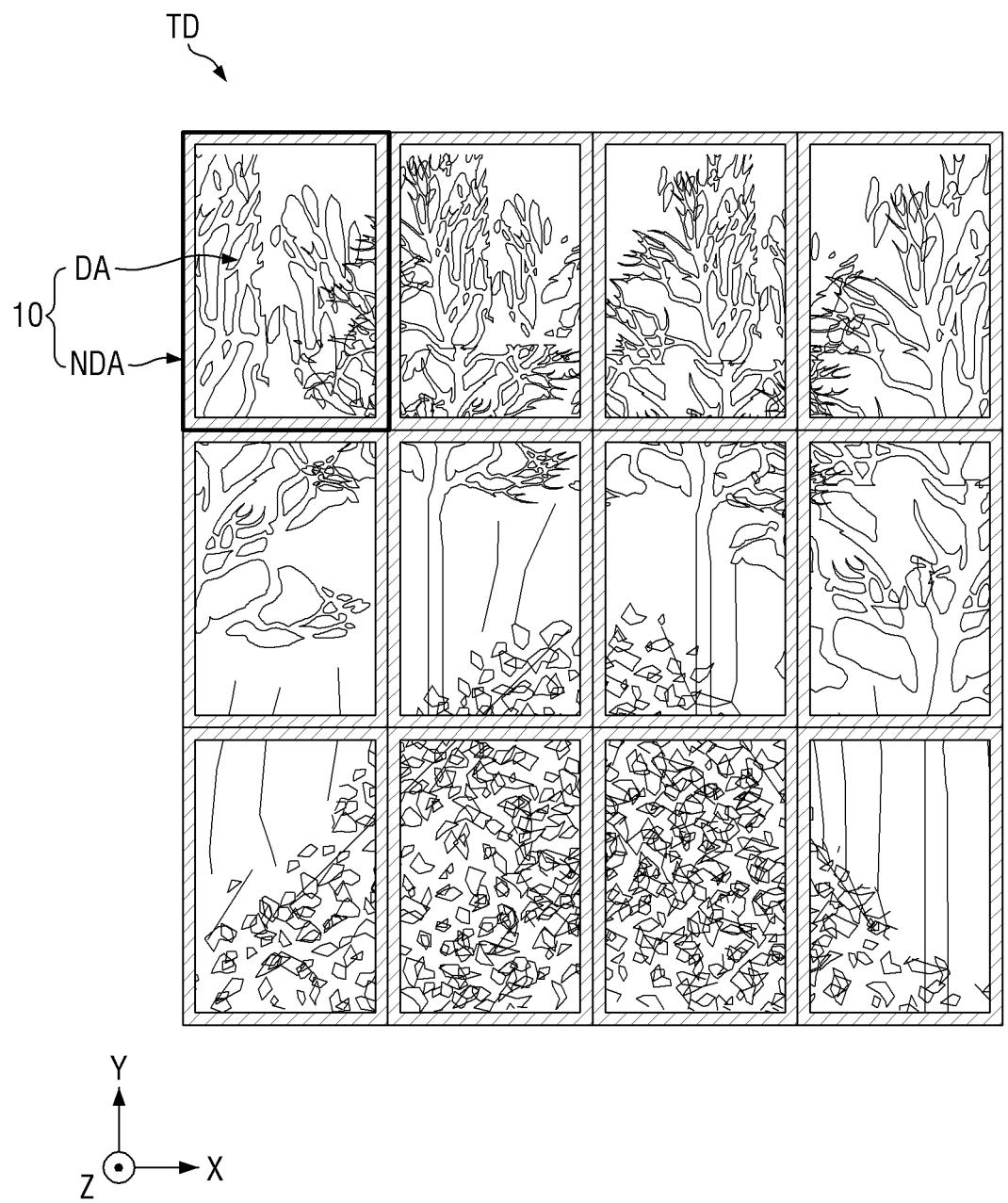
FIG. 1 is a plan view illustrating a tiled display device according to an embodiment.

In the following description, for the purposes of explanation, numerous details are set forth in order to provide a thorough understanding of various embodiments or implementations. As used herein "embodiments" and "implementations" are interchangeable words that are non-limiting examples of devices or methods employing one or more of the embodiments disclosed herein. It is apparent, however, that various embodiments may be practiced without specific details or with one or more equivalent arrangements. In other instances, structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in an embodiment without departing from the disclosure.

Unless otherwise specified, the illustrated embodiments are to be understood as providing features of varying detail of ways in which the disclosure may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the disclosure.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (for example, as in "sidewall"), and the like, may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (for example, rotated 90 degrees or at other orientations), and, as such, the spatially relative descriptors used herein interpreted accordingly.

Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art.

The terminology used herein is for the purpose of describing embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

For example, "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As in the field, embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (for example, microcode) to perform various functions discussed herein and may optionally be driven by firmware and/or software. It is also contemplated that each block, unit, and/or module may be implemented by dedicated hardware, or as a combination of dedicated hardware to perform some functions and a processor (for example, one or more programmed microprocessors and associated circuitry) to perform other functions. Also, each block, unit, and/or module of embodiments may be physically separated into two or more interacting and discrete blocks, units, and/or modules without departing from the scope of the disclosure. Further, the blocks, units, and/or modules of embodiments may be physically combined into more complex blocks, units, and/or modules without departing from the scope of the disclosure.

Unless otherwise defined, all terms (including technical and scientific terms) used herein have the same meaning as commonly understood by one of ordinary skill in the art to which this disclosure pertains. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a plan view illustrating a tiled display device according to an embodiment.

Referring to FIG. 1, a tiled display device TD may include a plurality of display devices 10. The plurality of display devices 10 may be arranged or disposed in a grid form, but are not limited thereto. The plurality of display devices 10 may be connected in a first direction (X-axis direction) or a second direction (Y-axis direction), and the tiled display device TD may have a shape. For example, the plurality of display devices 10 may have the same size, but are not limited thereto. For another example, the plurality of display devices 10 may have different sizes.

Each of the plurality of display devices 10 may have a substantially rectangular shape including long sides and short sides. The plurality of display devices 10 may be arranged or disposed such that the long sides or the short sides thereof may be connected to each other. Some or a number of the display devices 10 may be disposed at the edge of the tiled display device TD to form one or a side of the tiled display device TD. Some or a number of others of the display devices 10 may be disposed at corners of the tiled display device TD to form two adjacent sides of the tiled display device TD. Yet some or a number of others of the display devices 10 may be disposed on the inner side of the tiled display device TD, and may be surrounded by or may be adjacent to other display devices 10.

Each of the plurality of display devices 10 may include a display area DA and a non-display area NDA. The display area DA may include a plurality of pixels to display an image. The non-display area NDA may be disposed around the display area DA to surround or to be adjacent to the display area DA, and may not display an image.

The tiled display device TD may have a substantially planar shape as a whole, but is not limited thereto. The tiled display device TD may have a three-dimensional shape to provide a three-dimensional effect to a user. For example, in a case that the tiled display device TD has a three-dimensional shape, at least some or a number of the plurality of display devices 10 may have a substantially curved shape. For another example, the plurality of display devices 10 may each have a substantially planar shape and may be connected to each other at a predetermined angle, so that the tiled display device TD may have a three-dimensional shape.

The tiled display device TD may be formed by connecting the non-display areas NDA of the adjacent display devices 10. The plurality of display devices 10 may be connected to each other through a coupling or connecting member or an adhesive member. Accordingly, the non-display areas NDA between the plurality of display devices 10 may be surrounded by the adjacent display areas DA. The distance between the display areas DA of the plurality of display devices 10 may be small enough that the non-display areas NDA between the plurality of display devices 10 or the boundary portions between the plurality of display devices 10 are not recognized by the user. For example, the reflectance of external light of the display areas DA of the plurality of display devices 10 may be substantially the same as that of the non-display areas NDA between the plurality of display devices 10. Accordingly, in the tiled display device TD, the boundary portions or the non-display areas NDA between the plurality of display devices 10 may be prevented from being recognized, thereby removing a sense of disconnection between the plurality of display devices 10 and improving a sense of immersion in an image.

Figure 2:
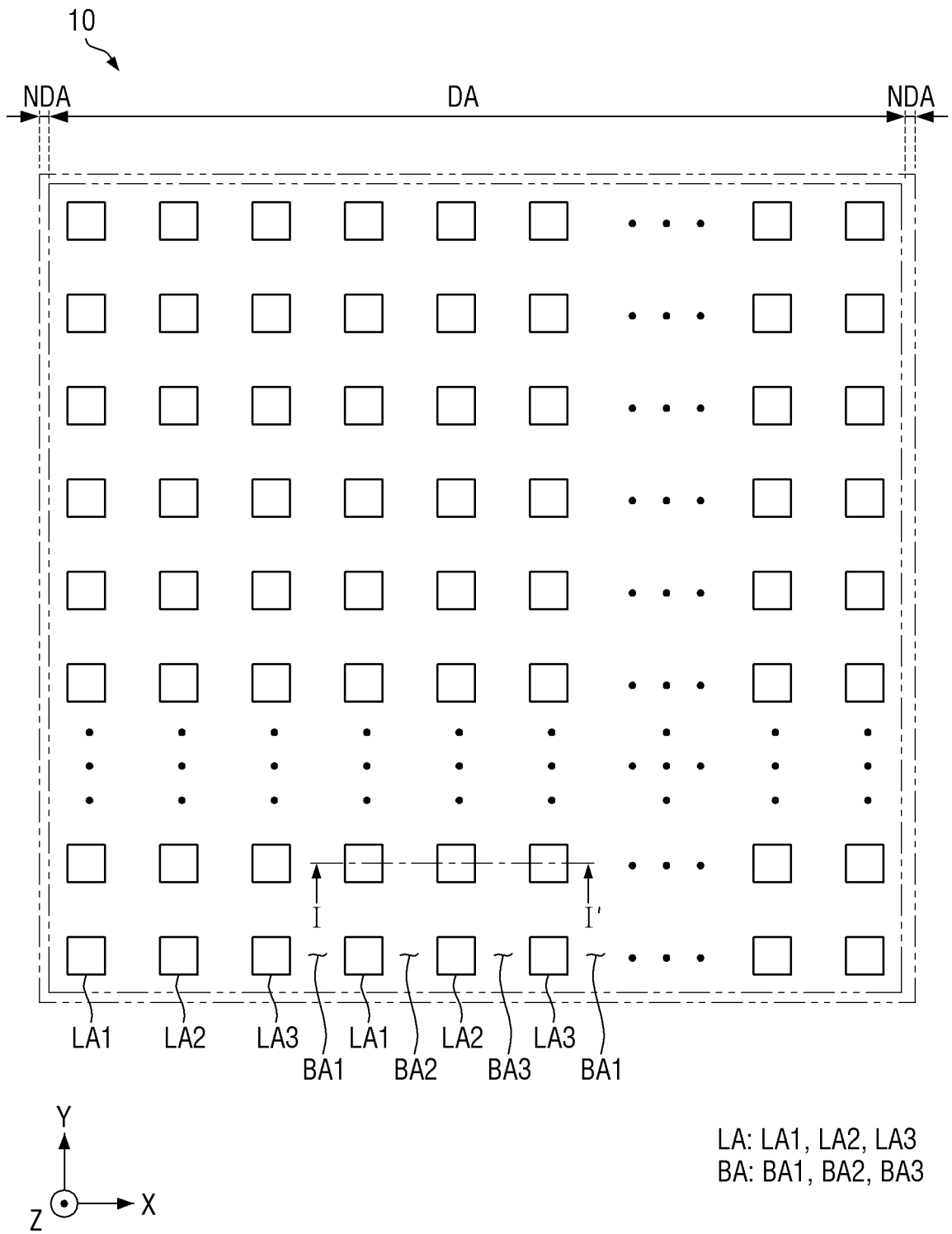
FIG. 2 is a plan view illustrating a display device according to an embodiment.

FIG. 2 is a plan view illustrating a display device according to an embodiment.

Referring to FIG. 2, the display device 10 may include a plurality of pixels arranged or disposed along a plurality of rows and columns in the display area DA. Each of the plurality of pixels may include an emission area LA defined by a pixel defining layer or bank, and may emit light having a predetermined peak wavelength through the emission area LA. For example, the display area DA of the display device 10 may include first to third emission areas LA1, LA2, and LA3. Each of the first to third emission areas LA1, LA2, and LA3 may be an area in which light generated from a light emitting element of the display device 10 is emitted to the outside of the display device 10.

The first to third emission areas LA1, LA2, and LA3 may emit light having a predetermined peak wavelength to the outside of the display device 10. The first emission area LA1 may emit light of a first color, the second emission area LA2 may emit light of a second color, and the third emission area LA3 may emit light of a third color. For example, the first color light may be red light having a peak wavelength in the range from about 610 nm to about 650 nm, the second color light may be green light having a peak wavelength in the range from about 510 nm to about 550 nm, and the third color light may be blue light having a peak wavelength in the range from about 440 nm to about 480 nm, but the disclosure is not limited thereto.

The first to third emission areas LA1, LA2, and LA3 may be sequentially arranged or disposed repetitively in the first direction (X-axis direction) in the display area DA. For example, the first emission area LA1 may be larger in size than the second emission area LA2, and the second emission area LA2 may be larger in size than the third emission area LA3. For another example, the first emission area LA1, the second emission area LA2, and the third emission area LA3 may be substantially the same in size.

The display area DA of the display device 10 may include a plurality of light blocking areas BA that surround the plurality of emission areas LA. For example, the display area DA may include first to third light blocking areas BA1, BA2, and BA3. The first to third light blocking areas BA1, BA2, and BA3 may be disposed at one or a side of the first to third emission areas LA1, LA2, and LA3, respectively, to prevent the colored lights emitted through the first to third emission areas LA1, LA2, and LA3 from mixing with one another.

Figure 3:
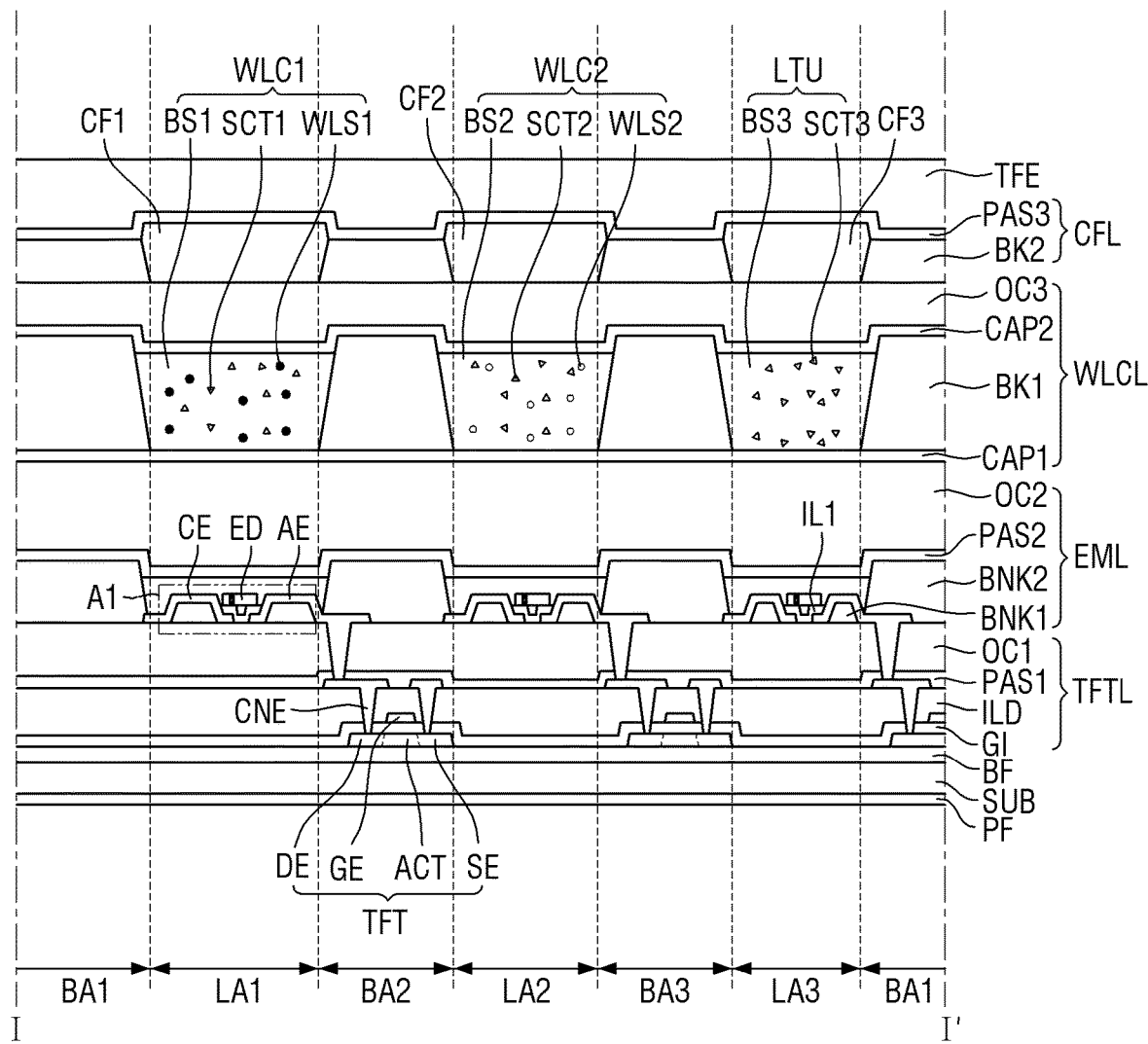
FIG. 3 is a schematic cross-sectional view taken along line I-I' of FIG. 2.

FIG. 3 is a schematic cross-sectional view taken along line I-I' of FIG. 2.

Referring to FIG. 3, the display area DA of the display device 10 may include first to third emission areas LA1, LA2, and LA3. Each of the first to third emission areas LA1, LA2, and LA3 may be an area in which light generated from a light emitting diode ED of the display device 10 is emitted to the outside of the display device 10.

The display device 10 may include a protective film PF, a substrate SUB, a buffer layer BF, a thin film transistor layer TFTL, a light emitting element layer EML, a wavelength conversion layer WLCL, a color filter layer CFL, and an encapsulation layer TFE.

The protective film PF may be disposed below the substrate SUB. The protective film PF may protect the bottom surface of the substrate SUB. The protective film PF may include an inorganic insulating material preventing infiltration of air or moisture, but is not limited thereto.

The substrate SUB may be disposed on the protective film PF. The substrate SUB may be a base substrate or a base member, and may be made of an insulating material such as a polymer resin. For example, the substrate SUB may be a rigid substrate. In a case that the substrate SUB is a rigid substrate, the substrate SUB may include a glass material or a metal material, but is not limited thereto. In another example, the substrate SUB may be a flexible substrate which can be bent, folded and rolled. In a case that the substrate SUB is a flexible substrate, the substrate SUB may include polyimide (PI), but is not limited thereto.

The buffer layer BF may be disposed on the substrate SUB. The buffer layer BF may be formed of an inorganic material preventing infiltration of air or moisture. For example, the buffer layer BF may include a plurality of inorganic films laminated alternately.

The thin film transistor layer TFTL may include a thin film transistor TFT, a gate insulating layer GI, an interlayer insulating layer ILD, a connection electrode CNE, a first passivation layer PAS1, and a first planarization layer OC1.

The thin film transistor TFT may be disposed on the buffer layer BF, and may constitute a pixel circuit of each of a plurality of pixels. For example, the thin film transistor TFT may be a switching transistor or a driving transistor of the pixel circuit. The thin film transistor TFT may include a semiconductor region ACT, a gate electrode GE, a source electrode SE, and a drain electrode DE.

The semiconductor region ACT, the source electrode SE, and the drain electrode DE may be disposed on the buffer layer BF. The semiconductor region ACT may overlap the gate electrode GE in the thickness direction, and may be insulated from the gate electrode GE by the gate insulating layer GI. The source electrode SE and the drain electrode DE may be provided by making a material of the semiconductor region ACT conductive.

The gate electrode GE may be disposed on the gate insulating layer GI. The gate electrode GE may overlap the semiconductor region ACT with the gate insulating layer GI interposed therebetween.

The gate insulating layer GI may be provided or disposed on the semiconductor region ACT, the source electrode SE, and the drain electrode DE. For example, the gate insulating layer GI may cover or overlap the semiconductor region ACT, the source electrode SE, the drain electrode DE, and the buffer layer BF, and may insulate the semiconductor region ACT from the gate electrode GE. The gate insulating layer GI may include a contact hole through which the connection electrode CNE passes.

The interlayer dielectric layer ILD may be disposed on the gate electrode GE. For example, the interlayer insulating layer ILD may include a contact hole through which the connection electrode CNE passes. Here, the contact hole of the interlayer insulating layer ILD may be connected to the contact hole of the gate insulating layer GI.

The connection electrode CNE may be disposed on the interlayer insulating layer ILD. The connection electrode CNE may electrically connect the drain electrode DE of the thin film transistor TFT to a first electrode AE of a light emitting element EL. The connection electrode CNE may be in contact with the drain electrode DE through the contact holes provided or disposed in the gate insulating layer GI and the interlayer insulating layer ILD.

The first passivation layer PAS1 may be provided or disposed on the connection electrode CNE to protect the thin film transistor TFT. For example, the first passivation layer PAS1 may include a contact hole through which the first electrode AE of the light emitting element EL passes.

The first planarization layer OC1 may be provided or disposed on the first passivation layer PAS1 to planarize a top portion of the thin film transistor layer TFTL. For example, the first planarization layer OC1 may include a contact hole through which the first electrode AE of the light emitting element EL passes. Here, the contact hole of the first planarization layer OC1 may be connected to the contact hole of the first passivation layer PAS1. The first planarization layer OC1 may include an organic material.

The light emitting element layer EML may include a light emitting element EL, a first bank BNK1, a second bank BNK2, a second passivation layer PAS2, and a second planarization layer OC2.

The light emitting element EL may be provided or disposed on the thin film transistor TFT. The light emitting element EL may include the first electrode AE, a second electrode CE, and the light emitting diode ED.

The first electrode AE may be provided or disposed on the first planarization layer OC1. For example, the first electrode AE may be disposed on the first bank BNK1 disposed on the first planarization layer OC1 to cover or overlap the first bank BNK1. The first electrode AE may be disposed to overlap one of the first to third emission areas LA1, LA2, and LA3 defined by the second bank BNK2. Further, the first electrode AE may be electrically connected to the drain electrode DE of the thin film transistor TFT. The first electrode AE may be an anode electrode of the light emitting element EL, but is not limited thereto.

The second electrode CE may be disposed on the first planarization layer OC1 to be spaced apart from the first electrode AE. For example, the second electrode CE may be disposed on the first bank BNK1 disposed on the first planarization layer OC1 to cover or overlap the first bank BNK1. The second electrode CE may be disposed to overlap one of the first to third emission areas LA1, LA2, and LA3 defined by the second bank BNK2. For example, the second electrode CE may receive a common voltage supplied to all pixels. The second electrode CE may be a cathode electrode of the light emitting element EL, but is not limited thereto.

A first insulating layer IL1 may cover or overlap a part of the first electrode AE and a part of the second electrode CE that are adjacent to each other, and may insulate the first electrode AE from the second electrode CE.

The light emitting diode ED may be disposed between the first electrode AE and the second electrode CE on the first planarization layer OC1. The light emitting diode ED may be disposed on the first insulating layer IL1. One or an end of the light emitting diode ED may be electrically connected to the first electrode AE, and the other or another end of the light emitting diode ED may be electrically connected to the second electrode CE. For example, a plurality of light emitting diodes ED may include active layers having the same or similar material and emit light of the same wavelength band or light of the same color. Light emitted from each of the first to third emission areas LA1, LA2, and LA3 may have the same color. For example, the light emitting diodes ED may emit the third color light or blue light having a peak wavelength in the range of about 440 nm to about 480 nm. Therefore, the light emitting element layer EML may emit the third color light or blue light.

The second bank BNK2 may be disposed on the first planarization layer OC1 to define the first to third emission areas LA1, LA2, and LA3. For example, the second bank BNK2 may surround each of the first to third emission areas LA1, LA2, and LA3, but is not limited thereto. The second bank BNK2 may separate and insulate the first electrode AE or the second electrode CE of each of a plurality of light emitting elements EL. The second bank BNK2 may be disposed in the first to third light blocking areas BA1, BA2, and BA3.

The second passivation layer PAS2 may be disposed on the plurality of light emitting elements EL and the second bank BNK2. The second passivation layer PAS2 may cover or overlap the plurality of light emitting elements EL and may protect the plurality of light emitting elements EL. The second passivation layer PAS2 may prevent infiltration of impurities such as moisture or air from the outside to prevent damage to the plurality of light emitting elements EL.

The second planarization layer OC2 may be provided or disposed on the second passivation layer PAS2 to planarize a top portion of the light emitting element layer EML. For example, the second planarization layer OC2 may include an organic material.

The wavelength conversion layer WLCL may include a first capping layer CAP1, a first light blocking member BK1, a first wavelength conversion member WLC1, a second wavelength conversion member WLC2, a light transmission member LTU, and a second capping layer CAP2, and a third planarization layer OC3.

The first capping layer CAP1 may be disposed on the second planarization layer OC2 of the light emitting element layer EML. The first capping layer CAP1 may seal the bottom surfaces of the light transmission member LTU and the first and second wavelength conversion members WLC1 and WLC2. For example, the first capping layer CAP1 may include an inorganic material.

The first light blocking member BK1 may be disposed in the first to third light blocking areas BA1, BA2, and BA3 on the first capping layer CAP1. The first light blocking member BK1 may overlap the second bank BNK2 in the thickness direction. The first light blocking member BK1 may block transmission of light. The first light blocking member BK1 may prevent light infiltration and color mixture between the first to third emission areas LA1, LA2, and LA3, which leads to the improvement of color reproducibility of the display device 10. The first light blocking member BK1 may be arranged or disposed in the form of a grid surrounding the first to third emission areas LA1, LA2, and LA3 in a plan view.

The first light blocking member BK1 may include an organic light blocking material and a lyophobic component. For example, the first light blocking member BK1 may be made of a black organic material including the lyophobic component. The first light blocking member BK1 may be formed through a coating and exposure process of an organic light blocking material including the lyophobic component.

The first wavelength conversion member WLC1 may be disposed in the first emission area LA1 on the first capping layer CAP1. The first wavelength conversion member WLC1 may be surrounded by the first light blocking member BK1. The first wavelength conversion member WLC1 may include a first base resin BS1, a first scatterer SCT1, and a first wavelength shifter WLS1.

The first base resin BS1 may contain a material having a relatively high light transmittance. The first base resin BS1 may be formed of a transparent organic material. For example, the first base resin BS1 may contain at least one of organic materials such as epoxy resin, acrylic resin, cardo resin, or imide resin.

The first scatterer SCT1 may have a refractive index different from that of the first base resin BS1 and form an optical interface with the first base resin BS1. For example, the first scatterer SCT1 may contain a light scattering material or light scattering particles that scatter at least a part of the transmitted light. For example, the first scatterer SCT1 may contain a metallic oxide such as titanium oxide ($TiO_2$), zirconium oxide ($ZrO_2$), aluminum oxide ($AL_2O_3$), indium oxide ($In_2O_3$), zinc oxide (ZnO), or tin oxide ($SnO_2$), or may contain organic particles such as acrylic resin and urethane resin. The first scatterer SCT1 may scatter light in random directions regardless of the incidence direction of the incident light without any substantial change of the peak wavelength of the incident light.

The first wavelength shifter WLS1 may change or shift the peak wavelength of the incident light to a first peak wavelength. For example, the first wavelength shifter WLS1 may convert blue light provided from the display device 10 into red light having a single peak wavelength in the range of about 610 nm to about 650 nm and emit the red light. The first wavelength shifter WLS1 may be a quantum dot, a quantum rod, or a fluorescent substance. The quantum dot may be a particulate material that emits light of a specific or predetermined color in a case that an electron transitions from a conduction band to a valence band.

A part of the blue light emitted from the light emitting element layer EML may pass through the first wavelength conversion member WLC1 without being converted to red light by the first wavelength shifter WLS1. As a part of the blue light emitted from the light emitting element layer EML, the light incident on the first color filter CF1 without being converted by the first wavelength conversion member WLC1 may be blocked by the first color filter CF1. The red light produced by the first wavelength conversion portion WLC1 converting the blue light emitted from the light emitting element layer EML may pass through the first color filter CF1 to be emitted to the outside. Accordingly, the red light is emitted through the first emission area LA1.

The second wavelength conversion member WLC2 may be disposed in the second emission area LA2 on the first capping layer CAP1. The second wavelength conversion member WLC2 may be surrounded by the first light blocking member BK1. The second wavelength conversion member WLC2 may include a second base resin BS2, a second scatterer SCT2, and a second wavelength shifter WLS2.

The second base resin BS2 may contain a material having a relatively high light transmittance. The second base resin BS2 may be formed of a transparent organic material. For example, the second base resin BS2 may be made of the same or similar material as the first base resin BS1, or may be made of the material described in association with the first base resin BS1.

The second scatterer SCT2 may have a refractive index different from that of the second base resin BS2 and form an optical interface with the second base resin BS2. For example, the second scatterer SCT2 may contain a light scattering material or light scattering particles scattering at least a part of the transmitted light. For example, the second scatterer SCT2 may be made of the same or similar material as the first scatterer SCT1, or may be made of the material described in association with the first scatterer SCT1. The second scatterer SCT2 may scatter the light in random directions regardless of the incidence direction of the incident light without any substantial change of the peak wavelength of the incident light.

The second wavelength shifter WLS2 may change or shift the peak wavelength of the incident light to a second peak wavelength different from the first peak wavelength of the first wavelength shifter WLS1. For example, the second wavelength shifter WLS2 may convert blue light provided from the display device 10 into green light having a single peak wavelength in the range of about 510 nm to about 550 nm and emit the green light. The second wavelength shifter WLS2 may be a quantum dot, a quantum rod, or a fluorescent substance. The second wavelength shifter WLS2 may contain the materials identical in purpose with the materials enumerated in association with the first wavelength shifter WLS1. The second wavelength shifter WLS2 may be formed of a quantum dot, a quantum rod, or a fluorescent substance to have a wavelength conversion range different from that of the first wavelength shifter WLS1.

The light transmission member LTU may be disposed in the third emission area LA3 on the first capping layer CAP1. The light transmission member LTU may be surrounded by the first light blocking member BK1. The light transmission member LTU may allow the incident light to pass therethrough while maintaining the peak wavelength of the light. The light transmission member LTU may include a third base resin BS3 and a third scatterer SCT3.

The third base resin BS3 may contain a material having a relatively high light transmittance. The third base resin BS3 may be formed of a transparent organic material. For example, the third base resin BS3 may be made of the same or similar material as the first base resin BS1 or the second base resin BS2, or may be made of the material described in association with the first base resin BS1 or the second base resin BS2.

The third scatterer SCT3 may have a refractive index different from that of the third base resin BS3 and form an optical interface with the third base resin BS3. For example, the third scatterer SCT3 may contain a light scattering material or light scattering particles scattering at least a part of the transmitted light. For example, the third scatterer SCT3 may be formed of the same or similar material as the first scatterer SCT1 or the second scatterer SCT2, or may be made of the material described in association with the first scatterer SCT1 or the second scatterer SCT2. The third scatterer SCT3 may scatter the light in random directions regardless of the incidence direction of the incident light without any substantial change of the peak wavelength of the incident light.

Since the wavelength conversion layer WLCL is disposed directly on the second planarization layer OC2 of the light emitting element layer EML, the display device 10 may not require a separate substrate for the first and second wavelength conversion members WLC1 and WLC2 and the light transmission member LTU. Accordingly, the first and second wavelength conversion members WLC1 and WLC2 and the light transmission member LTU may be easily aligned in the first to third emission areas LA1, LA2, and LA3, respectively, and the thickness of the display device 10 may be relatively reduced.

The second capping layer CAP2 may cover or overlap the first and second wavelength conversion members WLC1 and WLC2, the light transmission member LTU, and the first light blocking member BK1. For example, the second capping layer CAP2 may seal the first and second wavelength conversion members WLC1 and WLC2 and the light transmission member LTU to prevent the first and second wavelength conversion members WLC1 and WLC2 and the light transmission member LTU from damage or contamination. For example, the second capping layer CAP2 may include an inorganic material.

The third planarization layer OC3 may be disposed on the second capping layer CAP2 to planarize top portions of the first and second wavelength conversion members WLC1 and WLC2 and the light transmission member LTU. For example, the third planarization layer OC3 may include an organic material.

The color filter layer CFL may include a second light blocking member BK2, first to third color filters CF1, CF2, and CF3, and a third passivation layer PAS3.

The second light blocking member BK2 may be disposed in the first to third light blocking areas BA1, BA2, and BA3 on the third planarization layer OC3 of the wavelength conversion layer WLCL. The second light blocking member BK2 may overlap the first light blocking member BK1 or the second bank BNK2 in the thickness direction. The second light blocking member BK2 may block transmission of light. The second light blocking member BK2 may prevent light infiltration and color mixture between the first to third emission areas LA1, LA2, and LA3, which leads to the improvement of color reproducibility of the display device 10. The second light blocking member BK2 may be arranged or disposed in the form of a grid surrounding the first to third emission areas LA1, LA2, and LA3 in a plan view.

The first color filter CF1 may be disposed in the first emission area LA1 on the third planarization layer OC3. The first color filter CF1 may be surrounded by the second light blocking member BK2. The first color filter CF1 may overlap the first wavelength conversion member WLC1 in the thickness direction. The first color filter CF1 may selectively allow the first color light (for example, red light) to pass therethrough, and block or absorb the second color light (for example, green light) and the third color light (for example, blue light). For example, the first color filter CF1 may be a red color filter and contain a red colorant.

The second color filter CF2 may be disposed in the second emission area LA2 on the third planarization layer OC3. The second color filter CF2 may be surrounded by the second light blocking member BK2. The second color filter CF2 may overlap the second wavelength conversion member WLC2 in the thickness direction. The second color filter CF2 may selectively allow the second color light (for example, green light) to pass therethrough, and block or absorb the first color light (for example, red light) and the third color light (for example, blue light). For example, the second color filter CF2 may be a green color filter and contain a green colorant.

The third color filter CF3 may be disposed in the third emission area LA3 on the third planarization layer OC3. The third color filter CF3 may be surrounded by the second light blocking member BK2. The third color filter CF3 may overlap the light transmission member LTU in the thickness direction. The third color filter CF3 may selectively allow the third color light (for example, blue light) to pass therethrough, and block or absorb the first color light (for example, red light) and the second color light (for example, green light). For example, the third color filter CF3 may be a blue color filter and contain a blue colorant.

The first to third color filters CF1, CF2, and CF3 may absorb a part of the light coming from the outside of the display device 10 to reduce the reflected light of the external light. This may mean that the first to third color filters CF1, CF2, and CF3 may prevent color distortion caused by the reflection of the external light.

Since the first to third color filters CF1, CF2, and CF3 are directly disposed on the third planarization layer OC3 of the wavelength conversion layer WLCL, the display device 10 may not require a separate substrate for the first to third color filters CF1, CF2, and CF3. Therefore, the thickness of the display device 10 may be relatively reduced.

The third passivation layer PAS3 may cover or overlap the first to third color filters CF1, CF2, and CF3. The third passivation layer PAS3 may protect the first to third color filters CF1, CF2, and CF3.

The encapsulation layer TFE may be disposed on the third passivation layer PAS3 of the color filter layer CFL. The encapsulation layer TFE may cover or overlap the top and side surfaces of a display layer. For example, the encapsulation layer TFE may include at least one inorganic film to prevent permeation of oxygen or moisture. For example, the encapsulation layer TFE may include at least one organic film to protect the display device 10 from foreign substances such as dust.

Figure 4:
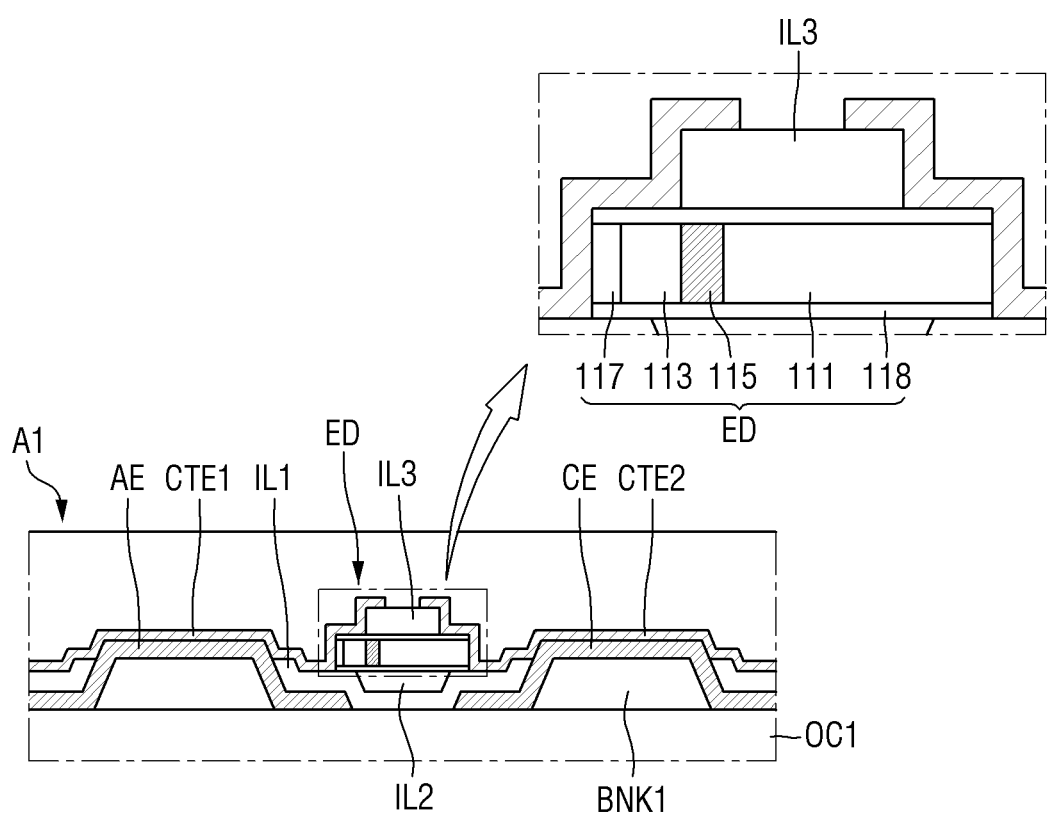
FIG. 4 is an enlarged view of area A1 of FIG. 3.

FIG. 4 is an enlarged view of area A1 of FIG. 3.

Referring to FIG. 4, the light emitting element layer EML of the display device 10 may be disposed on the thin film transistor layer TFTL, and may include first to third insulating layers IL1, IL2, and IL3.

The plurality of first banks BNK1 may be disposed in each of the first to third emission areas LA1, LA2, and LA3. Each of the first banks BNK1 may correspond to the first electrode AE or the second electrode CE. The plurality of first banks BNK1 may be disposed on the first planarization layer OC1, and the side surface of each of the plurality of first banks BNK1 may be inclined from the first planarization layer OC1. Each of the first and second electrodes AE and CE may be disposed on the corresponding first bank BNK1. The first bank BNK1 may include polyimide (PI), but is not limited thereto.

The first and second electrodes AE and CE may include a transparent conductive material. For example, each of the first and second electrodes AE and CE may include at least one of indium tin oxide (ITO), indium zinc oxide (IZO), or indium tin zinc oxide (ITZO), but is not limited thereto.

The first and second electrodes AE and CE may include a conductive material having high reflectivity. For example, the first and second electrodes AE and CE may include a metal such as silver (Ag), copper (Cu), or aluminum (Al) having high reflectivity. The first and second electrodes AE and CE may reflect light incident from the light emitting diode ED in an upward direction of the display device 10.

The first insulating layer IL1 may be disposed on the first planarization layer OC1, the first electrode AE, and the second electrode CE. The first insulating layer IL1 may cover or overlap a part of each of the first and second electrodes AE and CE. For example, the first insulating layer IL1 may expose a portion of the first and second electrodes AE and CE corresponding to the top surface of the first bank BNK1, and may cover or overlap a portion of the first and second electrodes AE and CE that does not correspond to the top surface thereof. Accordingly, the first insulating layer IL1 may include an opening exposing a portion of the first and second electrodes AE and CE corresponding to the top surface of the first bank BNK1.

For example, the first insulating layer IL1 may include an inorganic insulating material, and may include a stepped portion recessed between the first and second electrodes AE and CE. The second insulating layer IL2 may fill the recessed stepped portion of the first insulating layer IL1. Therefore, the second insulating layer IL2 may planarize the top surface of the first insulating layer IL1, and the light emitting diode ED may be disposed on the first and second insulating layers IL1 and IL2.

The first insulating layer IL1 may protect the first and second electrodes AE and CE, and may insulate the first and second electrodes AE and CE from each other. The first insulating layer IL1 may prevent the light emitting diode ED from being damaged by direct contact with other members.

The light emitting diode ED may be disposed between the first electrode AE and the second electrode CE on the first and second insulating layers IL1 and IL2. One end of the light emitting diode ED may be electrically connected to the first electrode AE, and the other end of the light emitting diode ED may be electrically connected to the second electrode CE. For example, the light emitting diode ED may be electrically connected to the first electrode AE through a first contact electrode CTE1, and may be electrically connected to the second electrode CE through a second contact electrode CTE2.

The light emitting diode ED may have a micro-meter or nano-meter size, and may be an inorganic light emitting diode including an inorganic material. The inorganic light emitting diode may be aligned between two electrodes facing each other by an electric field formed in a specific or predetermined direction between the two electrodes.

The light emitting diode ED may include a first semiconductor layer 111, a second semiconductor layer 113, an active layer 115, an electrode layer 117, and an insulating layer 118.

The first semiconductor layer 111 may be an n-type semiconductor. For example, in a case that the light emitting diode ED emits blue light, the first semiconductor layer 111 may include a semiconductor material having a chemical formula of $Al_xGa_yIn_{1-x-y}N$ ($0 \leq x \leq 1$, $0 \leq y \leq 1$, $0 \leq x+y \leq 1$). The first semiconductor layer 111 may include at least one semiconductor material of n-type doped AlGaInN, GaN, AlGaN, InGaN, AlN, or InN. The first semiconductor layer 111 may be doped with an n-type dopant such as Si, Ge, or Sn. The first semiconductor layer 111 may be n-type Si-doped n-GaN.

The second semiconductor layer 113 may be a p-type semiconductor. For example, in a case that the light emitting diode ED emits blue or green light, the second semiconductor layer 113 may include a semiconductor material having a chemical formula of $Al_xGa_yIn_{1-x-y}N$ ($0 \leq x \leq 1$, $0 \leq y \leq 1$, $0 \leq x+y \leq 1$). For example, the second semiconductor layer 113 may include at least one semiconductor material of p-type doped AlGaInN, GaN, AlGaN, InGaN, AlN, or InN. The second semiconductor layer 113 may be doped with a p-type dopant such as Mg, Zn, Ca, Se, or Ba. The second semiconductor layer 113 may be p-type Mg-doped p-GaN.

The active layer 115 may be disposed between the first and second semiconductor layers 111 and 113. The active layer 115 may include a material having a single or multiple quantum well structure. In a case that the active layer 115 may include a material having a multiple quantum well structure, a plurality of quantum layers and well layers may be stacked each other alternately. The active layer 115 may emit light by coupling of electron-hole pairs according to an electrical signal applied through the first and second semiconductor layers 111 and 113. For example, in a case that the active layer 115 emits blue light, it may include a material such as AlGaN or AlGaInN. In a case that the active layer 115 has a multiple quantum well structure in which quantum layers and well layers may be alternately stacked each other, the quantum layer may include a material such as AlGaN or AlGaInN, and the well layer may include a material such as GaN or AlInN. The active layer 115 may include AlGaInN as the quantum layer and AlInN as the well layer to emit blue light.

The electrode layer 117 may be an ohmic contact electrode. As another example, the electrode layer 117 may be a Schottky contact electrode. The light emitting diode ED may include at least one electrode layer 117. In a case that the light emitting diode ED is electrically connected to an electrode, the electrode layer 117 may reduce resistance between the light emitting diode ED and the electrode. The electrode layer 117 may contain a conductive metal.

The insulating layer 118 may surround the outer surfaces of the plurality of semiconductor layers and electrode layers. The insulating layer 118 may surround the outer surface of the active layer 115, and may extend in the extending direction of the light emitting diode ED. The insulating layer 118 may protect the light emitting diode ED. For example, the insulating layer 118 may surround the side surface of the light emitting diode ED, and may expose the both ends of the light emitting diode ED in the longitudinal direction. For example, the insulating layer 118 may include the active layer 115 to protect the outer surface of the light emitting diode ED, thereby preventing a decrease in light emission efficiency.

The third insulating layer IL3 may be partially disposed on the light emitting diode ED disposed between the first and second electrodes AE and CE. The third insulating layer IL3 may partially cover or overlap the outer surface of the light emitting diode ED. The third insulating layer IL3 may protect the light emitting diode ED.

The first contact electrode CTE1 may cover or overlap a part of the light emitting diode ED and the first electrode AE, and may electrically connect the first electrode AE to the light emitting diode ED. The second contact electrode CTE2 may cover or overlap another part of the light emitting diode ED and the second electrode CE, and may electrically connect the second electrode CE to the light emitting diode ED. The first and second contact electrodes CTE1 and CTE2 may include a conductive material. For example, the first and second contact electrodes CTE1 and CTE2 may include ITO, IZO, ITZO, aluminum (Al), or the like, but are not limited thereto.

Figure 5:
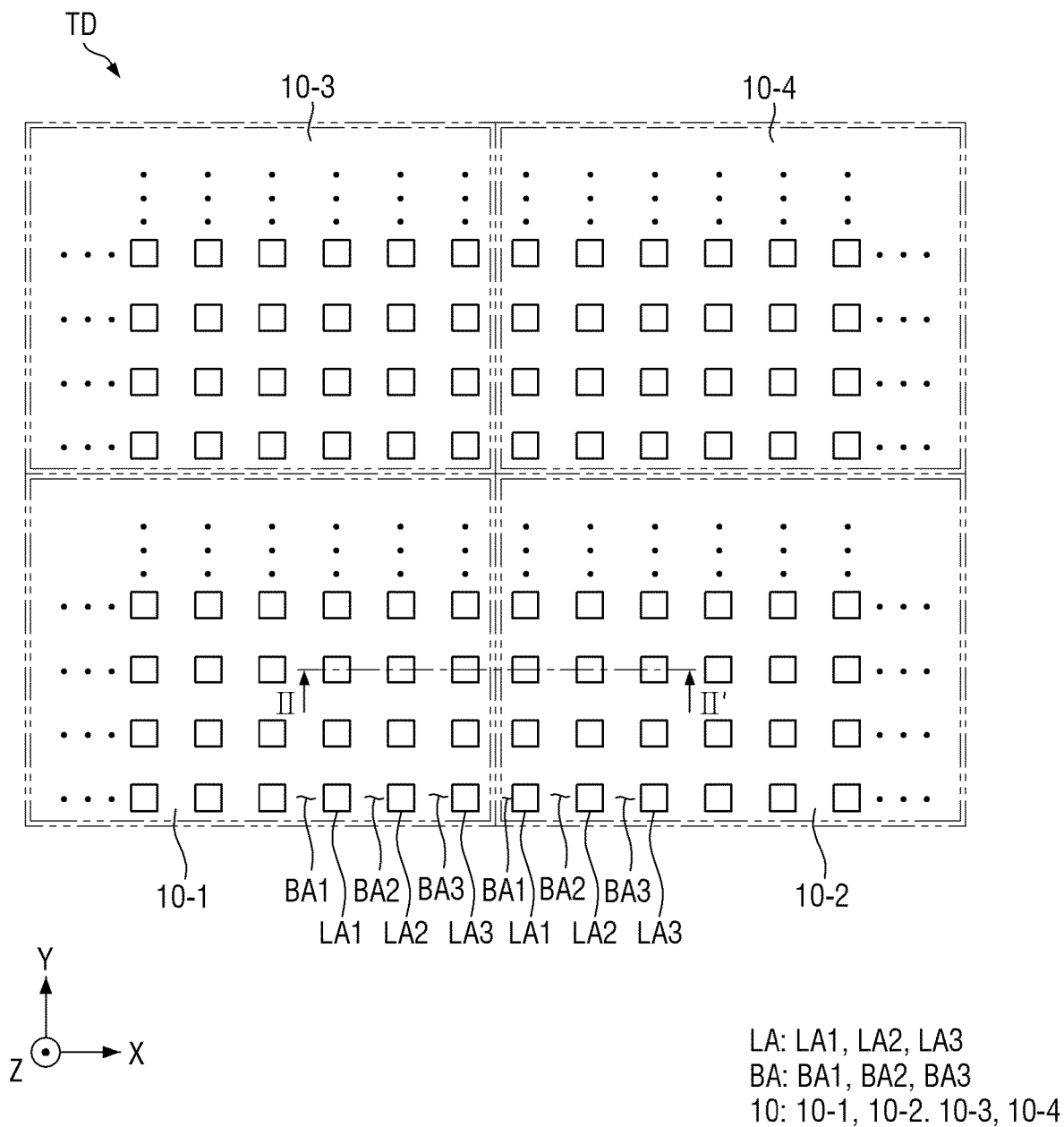
FIG. 5 is a plan view illustrating a coupling structure of a tiled display device according to an embodiment.
Figure 6:
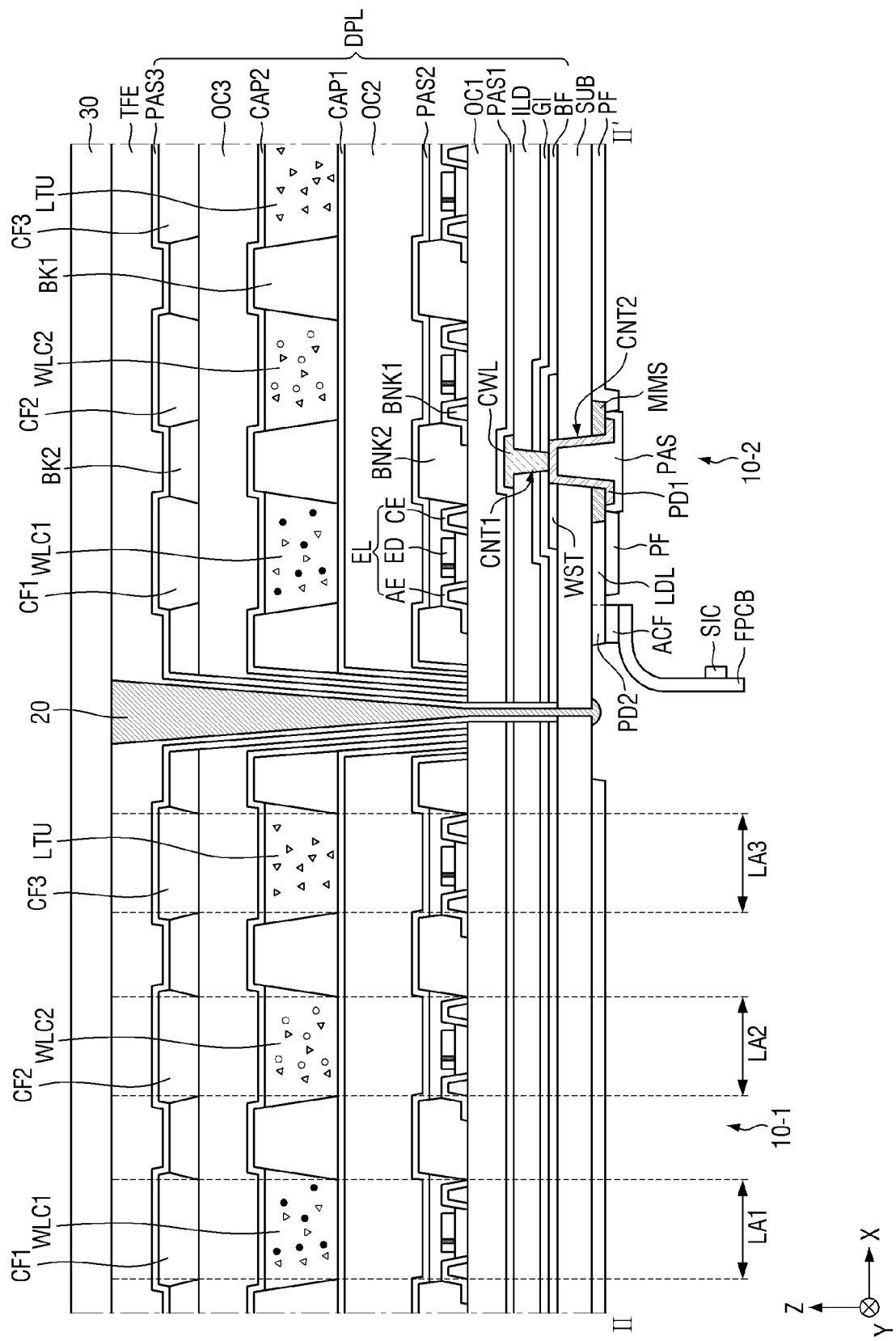
FIG. 6 is a schematic cross-sectional view taken along line II-II' of FIG. 5.

FIG. 5 is a plan view illustrating a coupling structure of a tiled display device according to an embodiment. FIG. 6 is a schematic cross-sectional view taken along line II-II' of FIG. 5. Hereinafter, the same configuration as the above-described configuration will be briefly described, or a description thereof will be omitted.

Referring to FIGS. 5 and 6, the tiled display device TD may include a plurality of display devices 10, a coupling member 20, and a cover member 30. For example, the tiled display device TD may include first to fourth display devices 10-1 to 10-4, but the number of the display devices 10 is not limited to that illustrated in the embodiment of FIG. 5. The number of the display devices 10 may be determined according to the size of each of the display devices 10 and the tiled display device TD.

The display device 10 may include a substrate SUB, an etching stopper WST, a connection line CWL, a display layer DPL, an encapsulation layer TFE, a metal pattern MIMS, a first pad unit PD1, and a protection part PAS, a lead line LDL, a second pad unit PD2, a protective film PF, a flexible film FPCB, and a source driver SIC.

The substrate SUB may be a base substrate or a base member, and may be made of an insulating material such as a polymer resin. For example, the substrate SUB may be a rigid substrate. In a case that the substrate SUB is a rigid substrate, the substrate SUB may include a glass material or a metal material, but is not limited thereto. In another example, the substrate SUB may be a flexible substrate which can be bent, folded and rolled. In a case that the substrate SUB is a flexible substrate, the substrate SUB may include polyimide (PI), but is not limited thereto.

The substrate SUB may include a second contact hole CNT2 penetrating from the bottom surface thereof. For example, the second contact hole CNT2 may penetrate from the bottom surface of the substrate SUB to the top surface of the substrate SUB. The second contact hole CNT2 may be disposed to overlap the display area DA. The first pad unit PD1 inserted into the second contact hole CNT2 may be disposed in the display area DA. The first pad unit PD1 may be formed through a coating process using a metal ink and a heat treatment process. Accordingly, the display device 10 may not include a separate pad unit disposed at the outermost side, and a bezel area or dead space of the display device 10 may be minimized. Since the first pad unit PD1 is disposed below the display device 10, the gap between the plurality of display devices 10 can be further reduced than in a case that the pad unit is disposed on the outermost side of the substrate or in a case that a flexible film is disposed on the side surface of the substrate.

The etching stopper WST may be disposed on the top surface of the substrate SUB. The etching stopper WST may be disposed between the substrate SUB and the display layer DPL. The etching stopper WST may include a second contact hole CNT2. The etching stopper WST may be disposed in a region on the top surface of the substrate SUB where the second contact hole CNT2 may be provided or disposed. The second contact hole CNT2 may penetrate from the bottom surface of the substrate SUB to the top surface of the etching stopper WST. For example, the second contact hole CNT2 of the substrate SUB may be formed through a wet etching process, and the second contact hole CNT2 of the etching stopper WST may be formed through a dry etching process, but the disclosure is not limited thereto.

The etching stopper WST may include an inorganic insulating material or an organic insulating material having resistance to wet etching. For example, the etching stopper WST may contain at least one of silicon nitride, aluminum nitride, zirconium nitride, titanium nitride, hafnium nitride, tantalum nitride, silicon oxide, aluminum oxide, titanium oxide, tin oxide, cerium oxide, or silicon oxynitride. For another example, the etching stopper WST may include at least one of acrylic resin, epoxy resin, phenolic resin, polyamide resin, or polyimide resin. A wet etching rate of the etching stopper WST may be lower than a wet etching rate of the substrate SUB. The etching stopper WST may prevent diffusion of an etching solution to the display layer DPL in the process of forming the second contact hole CNT2 of the substrate SUB using a wet etching process.

The connection line CWL may be disposed on the interlayer insulating layer ILD, and may be electrically connected to the first pad unit PD1 provided or disposed on the bottom surface of the substrate SUB through the first contact hole CNT1. The connection line CWL may be inserted into the first contact hole CNT1, and may be electrically connected to the first pad unit PD1 inserted into the second contact hole CNT2. The connection line CWL may supply an electric signal received from the first pad unit PD1 to the thin film transistor layer TFTL.

The connection line CWL may be electrically connected to a data line (not shown) provided or disposed in the thin film transistor layer TFTL, and may supply a data voltage received from the first pad unit PD1 to the data line. The data line may be electrically connected to the thin film transistor TFT of each of the plurality of pixels to supply a data voltage to the thin film transistor TFT. For example, the connection line CWL may be formed of the same or similar material on the same layer as the connection electrode CNE of the thin film transistor layer TFTL, but is not limited thereto.

The connection line CWL may be electrically connected to a gate line (not shown) provided or disposed in the thin film transistor layer TFTL, and may supply a gate signal received from the first pad unit PD1 to the gate line. The gate line may be electrically connected to the thin film transistor TFT of each of the plurality of pixels to supply a gate signal to the thin film transistor TFT. For example, the connection line CWL may be formed of the same or similar material on the same layer as the gate electrode GE of the thin film transistor TFT, but is not limited thereto.

The connection line CWL may be disposed between the plurality of emission areas LA. The connection line CWL may overlap the plurality of light blocking areas BA in the thickness direction. In FIG. 6, the connection line CWL may overlap the second bank BNK2, the first light blocking member BK1 corresponding to the second bank BNK2, and the second light blocking member BK2 corresponding to the first light blocking member BK1 in the thickness direction. Since the connection line CWL may be disposed between the plurality of emission areas LA of the display area DA, the display device 10 may not include a separate pad unit disposed at the outermost side, and a bezel area or dead space of the display device 10 may be minimized. Accordingly, by disposing the connection line CWL in the display area DA and disposing the flexible film FPCB on the bottom surface of the display device 10, the gap between the plurality of display devices 10 can be further reduced than in a case that a pad unit is disposed on the outermost side of the display panel or in a case that a flexible film is disposed on the side surface of the display panel.

The display layer DPL may be disposed on the substrate SUB. The display layer DPL may include the buffer layer BF, the thin film transistor layer TFTL, the light emitting element layer EML, the wavelength conversion layer WLCL, and the color filter layer CFL shown in FIG. 3. The encapsulation layer TFE may cover or overlap the top and side surfaces of the display layer DPL. Hereinafter, a description of the components described above with reference to FIG. 3 will be omitted.

The metal pattern MMS may be disposed to surround the second contact hole CNT2 on the bottom surface of the substrate SUB. The metal pattern MMS may include a metal oxide having wet etching resistance. Since the metal pattern MMS has wet etching resistance, it may not be damaged by an etching solution in a wet etching process. The wet etching rate of the metal pattern MMS may be lower than the wet etching rate of the substrate SUB. Accordingly, the metal pattern MMS may serve as a mask in the process of forming the second contact hole CNT2, and may determine the size and shape of the second contact hole CNT2 provided or disposed in the substrate SUB. For example, the metal pattern MMS may include at least one of molybdenum (Mo), aluminum (Al), chromium (Cr), tungsten (W), gold (Au), titanium (Ti), nickel (Ni), neodymium (Nd), or copper (Cu), but is not limited thereto.

The first pad unit PD1 may be disposed on the bottom surface of the substrate SUB and inserted into the second contact hole CNT2. The first pad unit PD1 may be electrically connected to the connection line CWL exposed through the second contact hole CNT2. The first contact hole CNT1 through which the connection line CWL passes and the second contact hole CNT2 through which the first pad unit PD1 passes may be connected to each other.

The first pad unit PD1 may be formed by coating metal ink including metal particles and performing a heat treatment process. The first pad unit PD1 may cover or overlap at least a part of the metal pattern MMS. The first pad unit PD1 may include a depression or a recess formed by a stepped portion of the second contact hole CNT2.

For example, the metal ink may contain metal particles and a solvent. The metal ink may be coated on the second contact hole CNT2 through an inkjet printing process or a dispensing process. The metal ink may cover or overlap at least a part of the metal pattern MMS provided in advance, and may temporarily fill the second contact hole CNT2. The solvent of the coated metal ink may be evaporated through a heat treatment process, and the first pad unit PD1 may be formed or disposed in the second contact hole CNT2 in the form of a metal film. Thus, the first pad unit PD1 may include a depression or a recess formed by a stepped portion of the second contact hole CNT2.

The first pad unit PD1 may be disposed in the display area DA. The first pad unit PD1 may be disposed between the plurality of emission areas LA. The first pad unit PD1 may overlap the plurality of light blocking areas BA in the thickness direction. Since the first pad unit PD1 is disposed in the display area DA, the display device 10 may not include a separate pad unit disposed at the outermost side, and a bezel area or dead space of the display device 10 may be minimized. Accordingly, by disposing the first pad unit PD1 in the display area DA and disposing the flexible film FPCB on the bottom surface of the display device 10, the gap between the plurality of display devices 10 can be further reduced than in a case that a pad unit is disposed on the outermost side of the display panel or in a case that a flexible film is disposed on the side surface of the display panel.

The protection part PAS may fill or may be disposed in the depression or the recess of the first pad unit PD1 formed by the stepped portion of the second contact hole CNT2. Optionally, the protection part PAS may cover or overlap a part of the metal pattern MMS or the protective film PF. The protection part PAS may protect the first pad unit PD1 that may not be covered or overlapped by the protective film PF, and may prevent damage to the first pad unit PD1.

For example, the protection part PAS may cover or overlap a plurality of first pad units PD1 on which the protective film PF may not be formed or disposed. The protection part PAS may include functional ink to be selectively coated on a region where the plurality of first pad units PD1 may be provided or disposed. Accordingly, the display device 10 may include the protective film PF covering or overlapping the bottom surface of the substrate SUB and the lead line LDL, and the protection part PAS covering or overlapping the first pad unit PD1, thereby stably protecting the bottom surface of the display device 10.

The lead line LDL may be disposed on the bottom surface of the substrate SUB, and may electrically connect the first pad unit PD1 and the second pad unit PD2 to each other. For example, the lead line LDL may be integral with the second pad unit PD2, but is not limited thereto. The lead line LDL may be in direct contact with the metal pattern MMS, and may be electrically connected to the first pad unit PD1 through the metal pattern MMS.

For example, the lead line LDL may be formed of a laminated structure of aluminum and copper (Ti/Cu) or a laminated structure of aluminum and titanium (Ti/Al/Ti), but is not limited thereto.

The second pad unit PD2 may be disposed on the bottom surface of the substrate SUB and may be spaced apart from the first pad unit PD1. The second pad unit PD2 may be electrically connected to the first pad unit PD1 through a lead line LDL. The second pad unit PD2 may receive various voltages or signals from the flexible film FPCB, and may supply the corresponding voltages or signals to the first pad unit PD1 and the connection line CWL.

For example, the second pad unit PD2 may be disposed in the display area DA, but is not limited thereto. For another example, the second pad unit PD2 may be disposed in the non-display area NDA as long as it does not increase the distance between the plurality of display devices 10.

The protective film PF may cover or overlap the bottom surface of the substrate SUB and the lead line LDL. The protective film PF may protect the bottom surface of the substrate SUB and the lead line LDL. The metal pattern MMS, the lead line LDL, the second pad unit PD2, and the protective film PF may be provided in advance before forming the second contact hole CNT2.

A connection film ACF may attach the flexible film FPCB to the second pad unit PD2. One surface of the connection film ACF may be attached to the second pad unit PD2, and the other surface of the connection film ACF may be attached to the flexible film FPCB. For example, the connection film ACF may cover or overlap the entire second pad unit PD2, but is not limited thereto.

The connection film ACF may include an anisotropic conductive film. In a case that the connection film ACF may include an anisotropic conductive film, the connection film ACF may have conductivity in a region where the second pad unit PD2 and a contact pad of the flexible film FPCB are in contact with each other, and may electrically connect the flexible film FPCB to the second pad unit PD2.

The flexible film FPCB may be disposed on the bottom surface of the substrate SUB. One or a side of the flexible film FPCB may be electrically connected to the second pad unit PD2, and the other or another side of the flexible film FPCB may be electrically connected to a source circuit board (not shown) on the bottom surface of the substrate SUB. The flexible film FPCB may transmit a signal from the source driver SIC to the display device 10. For example, the source driver SIC may be an integrated circuit (IC). In response to a source control signal of a timing controller, the source driver SIC may convert digital video data into an analog data voltage, and may supply it to a data line of the display area DA through the flexible film.

The tiled display device TD may couple the side surfaces of the adjacent display devices 10 to each other by using the coupling member 20 disposed between the plurality of display devices 10. The coupling member 20 may connect the side surfaces of the first to fourth display devices 10-1 to 10-4 arranged or disposed in a grid form to implement the tiled display device TD. The coupling member 20 may couple the side surfaces of the substrate SUB and the encapsulation layer TFE of each of the display devices 10 adjacent to each other.

For example, the coupling member 20 may be made of an adhesive or a double-sided tape having a relatively thin thickness to minimize the gap between the plurality of display devices 10. For another example, the coupling member 20 may be formed of a coupling frame having a relatively thin thickness to minimize the gap between the plurality of display devices 10. Accordingly, the tiled display device TD may make it possible to prevent the user from recognizing the boundary portions or the non-display areas NDA between the plurality of display devices 10.

The cover member 30 may be disposed on the top surfaces of the plurality of display devices 10 and the coupling member 20 to cover or overlap the plurality of display devices 10 and the coupling member 20. For example, the cover member 30 may be disposed on the top surface of the encapsulation layer TFE of each of the plurality of display devices 10. The cover member 30 may protect the top surface of the tiled display device TD.

FIGS. 7 to 14 are schematic cross-sectional views illustrating a manufacturing process of the display device of FIG. 6.

Figure 7:
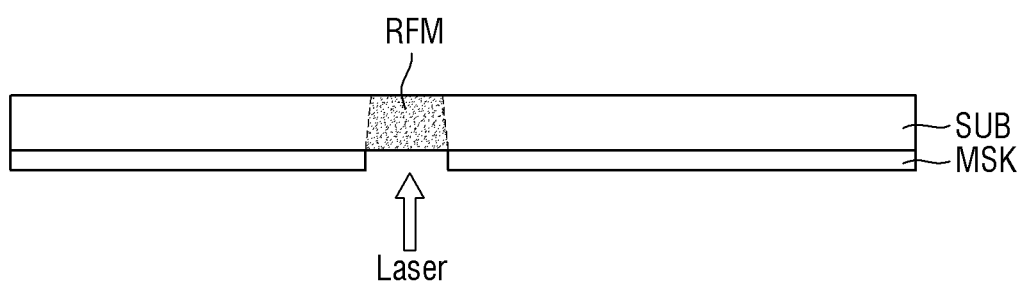
FIGS. 7 to 14 are schematic cross-sectional views illustrating a manufacturing process of the display device of FIG. 6.

In FIG. 7, a mask MSK may be disposed on the bottom surface of the substrate SUB. The mask MSK may be disposed on the bottom surface of the substrate SUB except for a region in which a modified region RFM may be formed or disposed. A laser may be irradiated onto the bottom surface of the substrate SUB. A portion of the substrate SUB exposed to the laser may be modified into the modified region RFM. The modified region RFM may have a state of being removable during a wet etching process of the substrate SUB.

Figure 8:
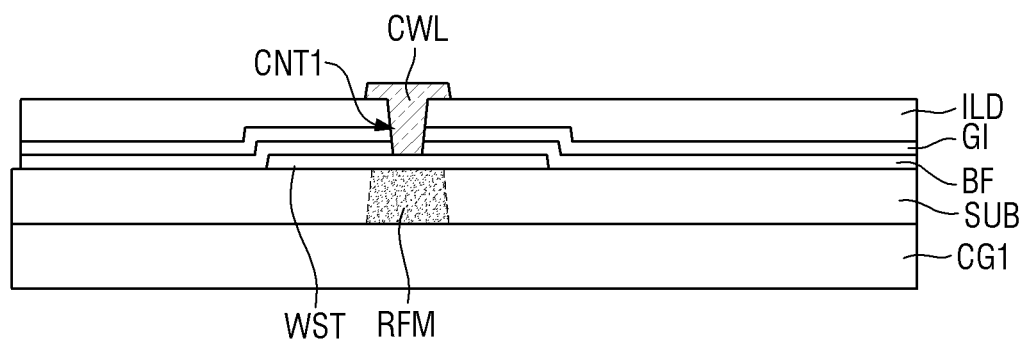

In FIG. 8, the substrate SUB may be provided or disposed on a first carrier substrate CG1. For example, the first carrier substrate CG1 may be a carrier glass, but is not limited thereto. The first carrier substrate CG1 may support the substrate SUB in a process of forming the display layer DPL and the encapsulation layer TFE on the substrate SUB.

The etching stopper WST may be disposed on the modified region RFM of the substrate SUB. The etching stopper WST may include an inorganic insulating material or an organic insulating material having wet etching resistance.

The buffer layer BF may be disposed on the etching stopper WST and the substrate SUB. The gate insulating layer GI and the interlayer insulating layer ILD may be sequentially stacked each other on the buffer layer BF. The first contact hole CNT1 may be formed to pass through the interlayer insulating layer ILD, the gate insulating layer GI, and the buffer layer BF.

The connection line CWL may be disposed on the interlayer insulating layer ILD, and may be inserted into the first contact hole CNT1. For example, the connection line CWL may be formed of the same or similar material on the same layer as the connection electrode CNE of the thin film transistor TFT, but is not limited thereto.

For another example, the connection line CWL may be formed of the same or similar material on the same layer as the gate electrode GE of the thin film transistor TFT. In a case that the connection line CWL is disposed on the same layer as the gate electrode GE, the connection line CWL may be disposed on the gate insulating layer GI.

Figure 9:
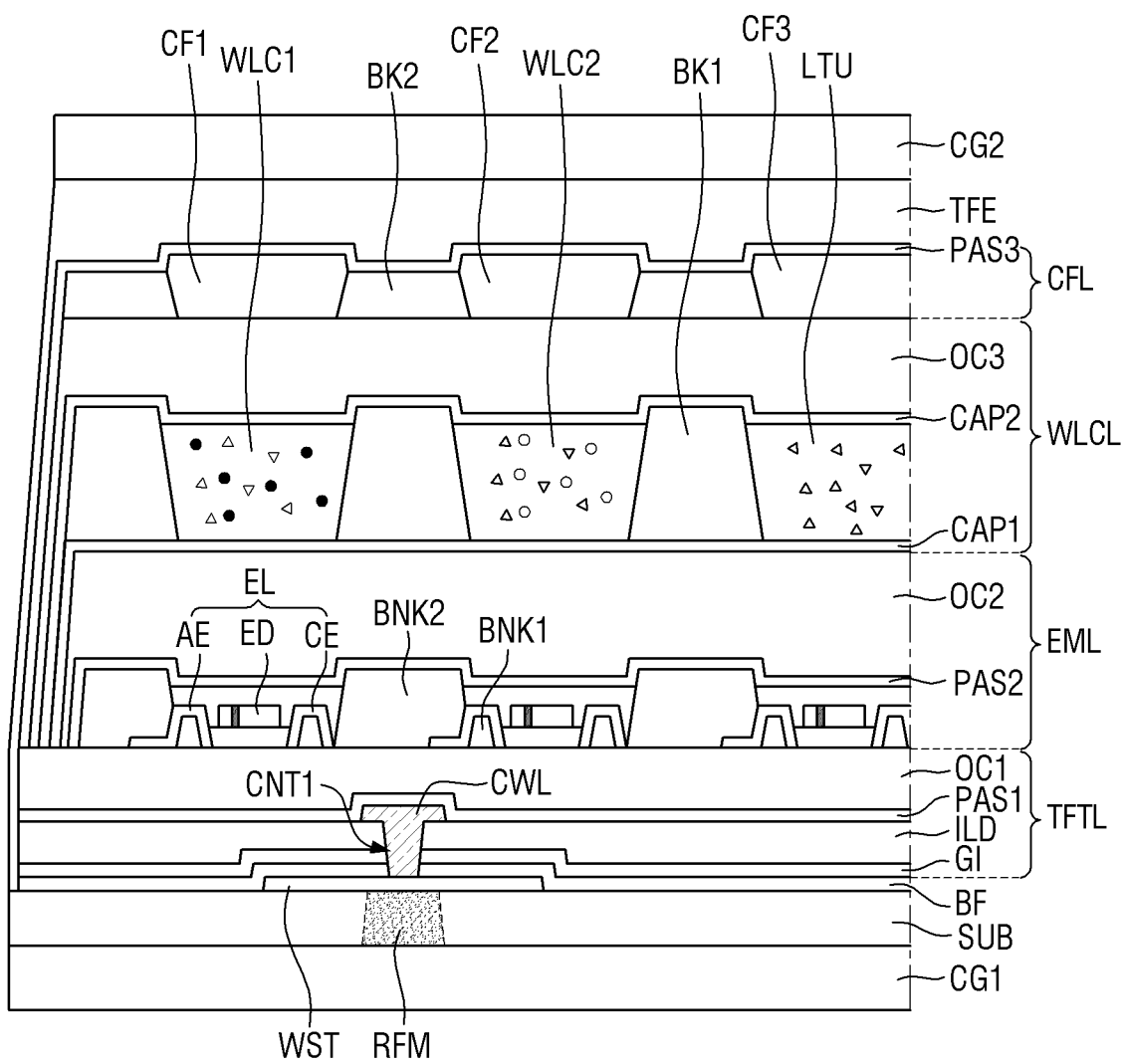

In FIG. 9, the first passivation layer PAS1 may cover or overlap the connection line CWL and the interlayer insulating layer ILD, and the first planarization layer OC1 may cover or overlap the first passivation layer PAS1.

The light emitting element layer EML, the wavelength conversion layer WLCL, the color filter layer CFL, and the encapsulation layer TFE may be sequentially stacked each other on the thin film transistor layer TFTL.

A second carrier substrate CG2 may be disposed on the encapsulation layer TFE. For example, the second carrier substrate CG2 may be a carrier glass, but is not limited thereto. The second carrier substrate CG2 may support the display device 10 in the process of forming the metal pattern MMS, the lead line LDL, the second pad unit PD2, and the protective film PF on the bottom surface of the substrate SUB. After the second carrier substrate CG2 is disposed, the display device being manufactured may be inverted, so that the second carrier substrate CG2 may support the display device, and the first carrier substrate CG1 may be exposed. The first carrier substrate CG1 may be removed after lamination of the display layer DPL and the encapsulation layer TFE is completed.

Figure 10:
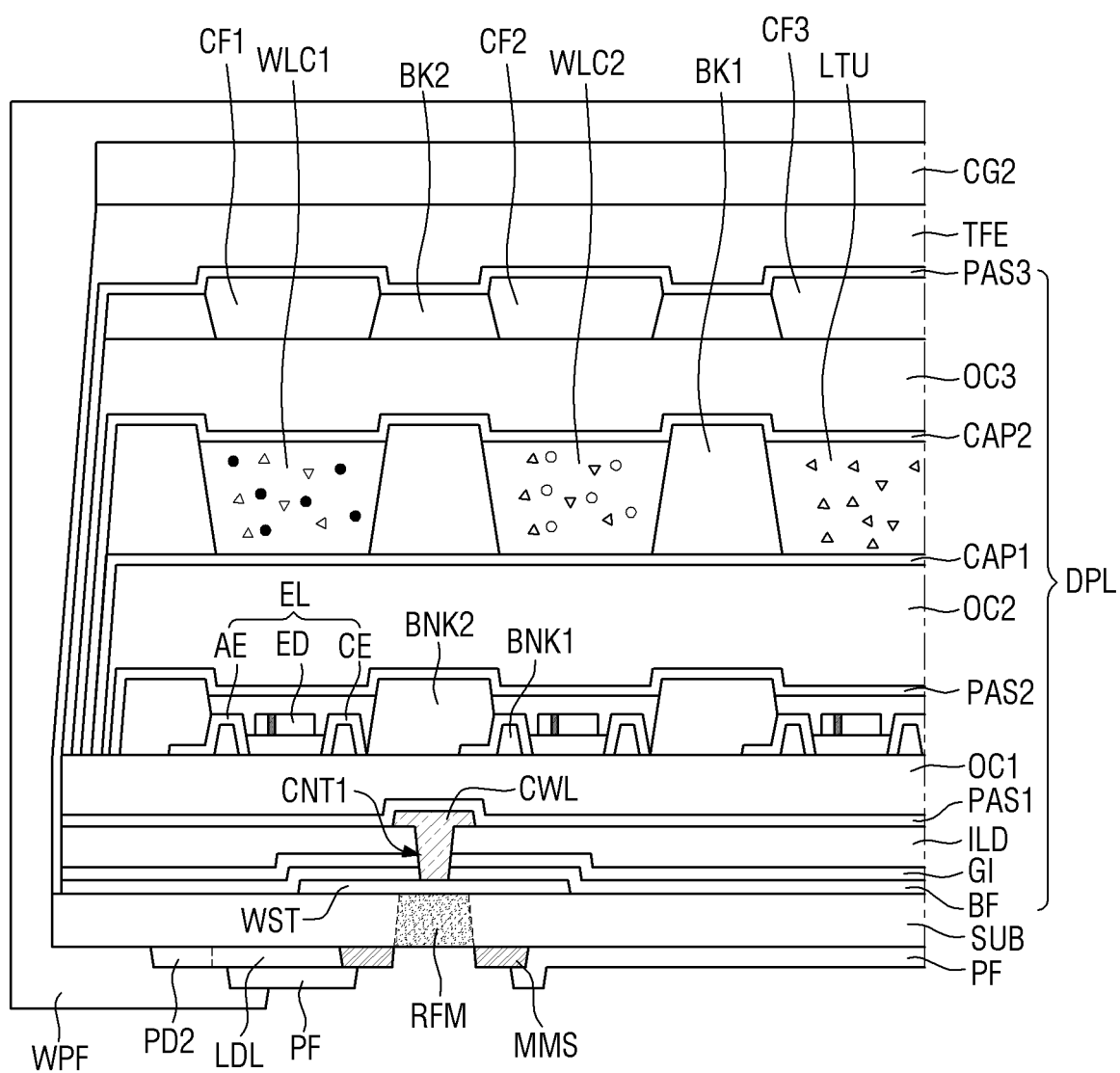

In FIG. 10, after the first carrier substrate CG1 is removed, the metal pattern MMS, the lead line LDL, the second pad unit PD2, and the protective film PF may be disposed on the bottom surface of the substrate SUB. The metal pattern MMS may be disposed on the bottom surface of the substrate SUB to surround the second contact hole CNT2 in a plan view. The metal pattern MMS may include a metal oxide having wet etching resistance.

The lead line LDL may be disposed on the bottom surface of the substrate SUB, and may be in direct contact with the metal pattern MIMS. For example, the lead line LDL may be integral with the second pad unit PD2, but is not limited thereto.

The second pad unit PD2 may be disposed on the bottom surface of the substrate SUB and may be spaced apart from the first pad unit PD1. The second pad unit PD2 may be electrically connected to the first pad unit PD1 through the lead line LDL. The second pad unit PD2 may receive various voltages or signals from the flexible film FPCB, and may supply the corresponding voltages or signals to the first pad unit PD1 and the connection line CWL.

The protective film PF may cover or overlap the bottom surface of the substrate SUB and the lead line LDL. The protective film PF may protect the bottom surface of the substrate SUB and the lead line LDL.

An etching protective film WPF may surround the second carrier substrate CG2, the side surfaces of the display device 10, and the bottom edges of the display device 10. For example, the etching protective film WPF may protect the side and top surfaces, and bottom edges of the display device 10 in a wet etching process of forming the second contact hole CNT2.

A bottom protective film (not shown) may cover or overlap a part of the protective film PF, the second pad unit PD2, and the lead line LDL. The bottom protective film may protect the bottom surface of the substrate SUB in the etching process of forming the second contact hole CNT2. For example, the bottom protective film may include a photoresist having wet etching resistance, but is not limited thereto. The bottom protective film may protect the bottom surface of the display device 10 in a wet etching process of forming the second contact hole CNT2.

Optionally, the bottom protective film may be omitted. In this case, the protective film PF may serve as a bottom protective film in the wet etching process. The protective film PF may include an inorganic insulating material or an organic insulating material having wet etching resistance, but is not limited thereto.

Figure 11:
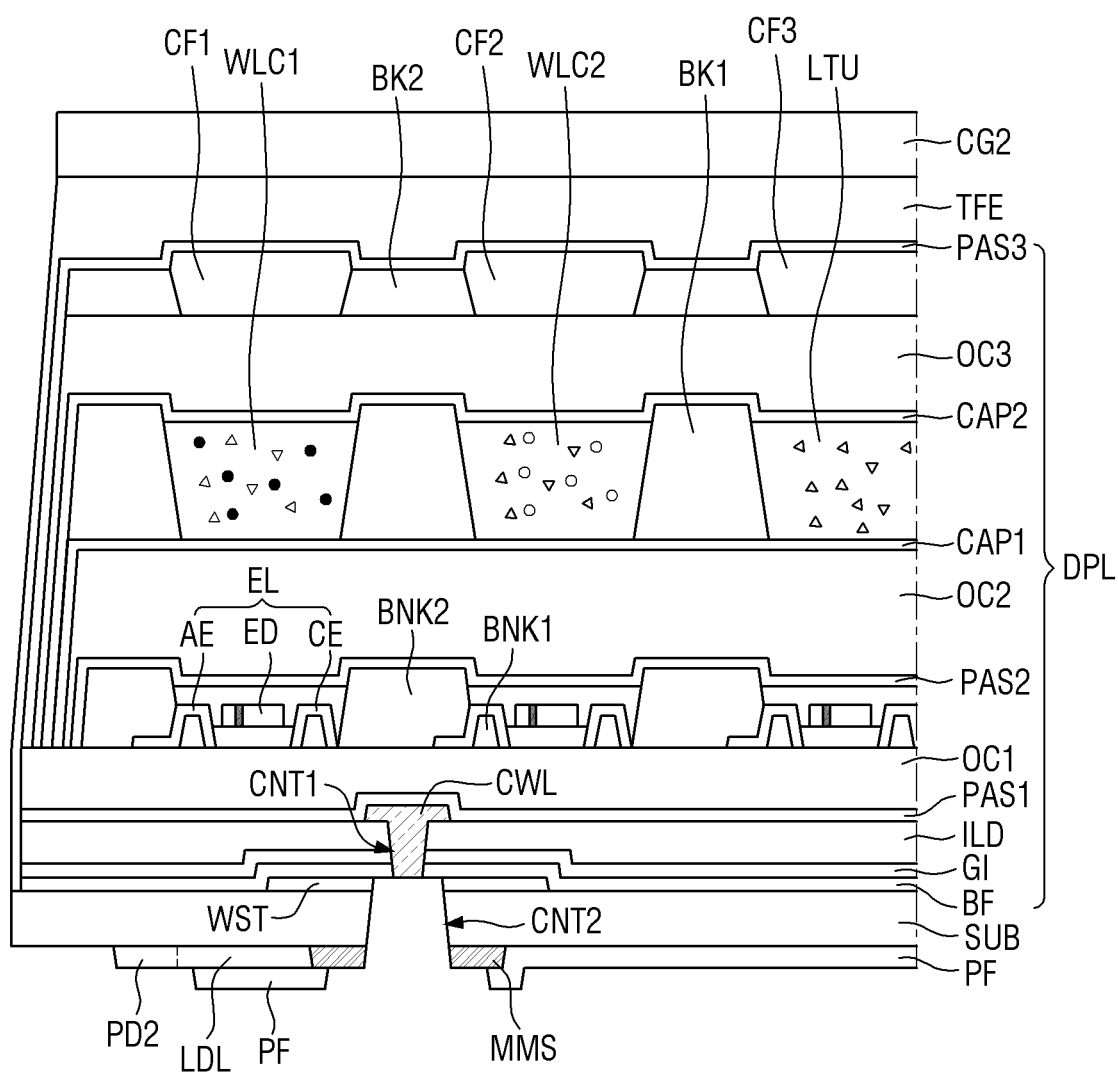

In FIG. 11, the modified region RFM of the substrate SUB may be removed in a wet etching process of the substrate SUB. The space from which the modified region RFM is removed may correspond to the second contact hole CNT2. The etching protective film WPF and the bottom protective film may be removed after the second contact hole CNT2 may be formed or disposed.

A portion of the etching stopper WST may be patterned by a dry etching process after the modified region RFM of the substrate SUB is removed. Accordingly, the second contact hole CNT2 may penetrate from the bottom surface of the substrate SUB to the top surface of the etching stopper WST. Since the second contact hole CNT2 may be formed or disposed, the connection line CWL may be exposed at the bottom surface of the substrate SUB.

Figure 12:
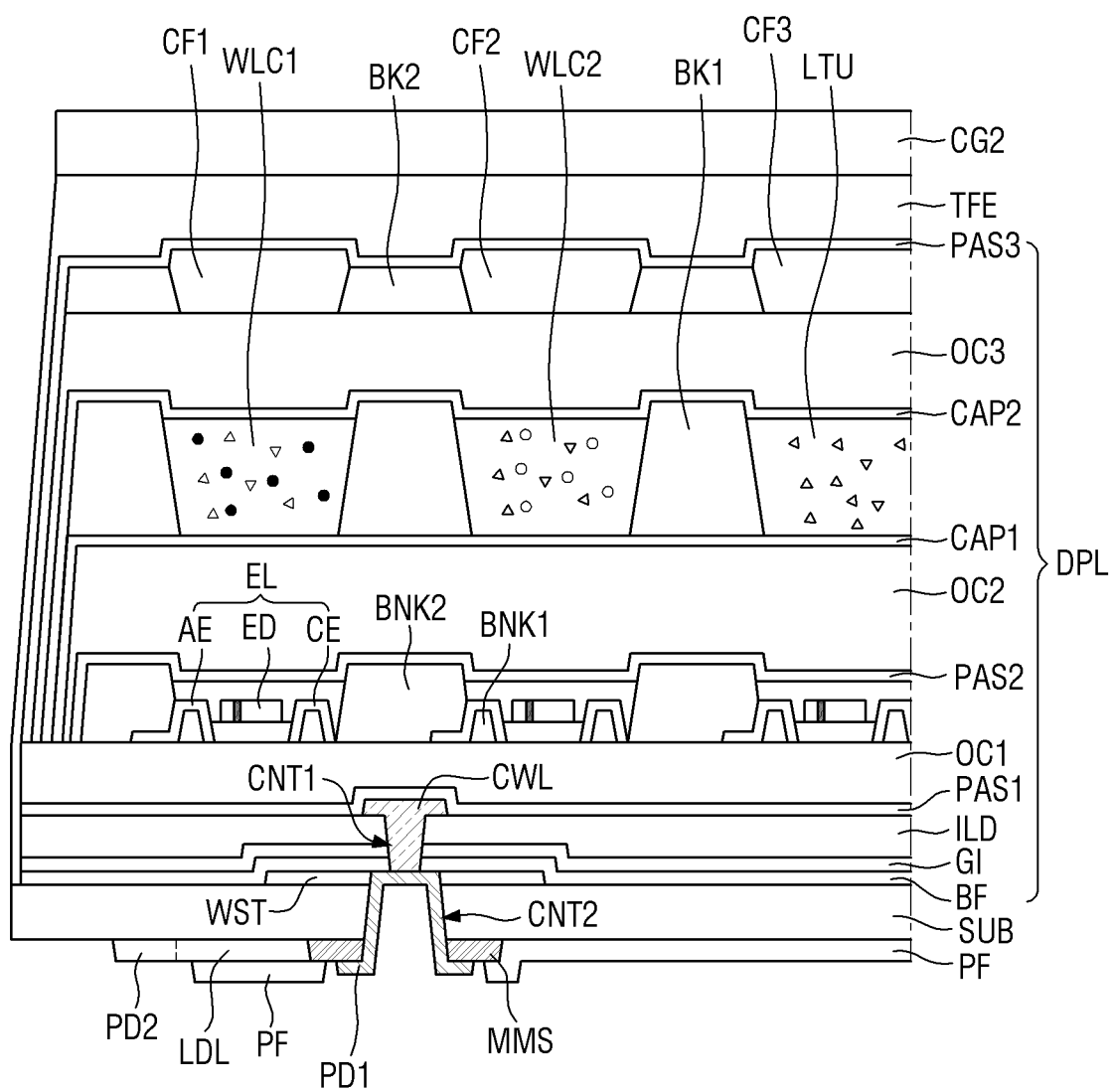

In FIG. 12, the first pad unit PD1 may be disposed on the bottom surface of the substrate SUB and inserted into the second contact hole CNT2. The first pad unit PD1 may be electrically connected to the connection line CWL exposed through the second contact hole CNT2. The first contact hole CNT1 through which the connection line CWL passes and the second contact hole CNT2 through which the first pad unit PD1 passes may be connected to each other.

The first pad unit PD1 may be formed by coating metal ink including metal particles and performing a heat treatment process. The first pad unit PD1 may cover or overlap at least a part of the metal pattern MIMS. The first pad unit PD1 may include a depression or a recess formed by a stepped portion of the second contact hole CNT2.

The metal ink may contain metal particles and a solvent. For example, the metal ink may be coated on the second contact hole CNT2 through an inkjet printing process or a dispensing process. The metal ink may cover or overlap at least a part of the metal pattern MMS provided in advance, and may temporarily fill the second contact hole CNT2. The solvent of the coated metal ink may be evaporated through a heat treatment process, and the first pad unit PD1 may be formed or disposed in the second contact hole CNT2 in the form of a metal film. Thus, the first pad unit PD1 may include a depression or a recess formed by a stepped portion of the second contact hole CNT2.

The first pad unit PD1 may be disposed in the display area DA. The first pad unit PD1 may be disposed between the plurality of emission areas LA. The first pad unit PD1 may overlap the plurality of light blocking areas BA in the thickness direction. Since the first pad unit PD1 is disposed in the display area DA, the display device 10 may not include a separate pad unit disposed at the outermost side, and a bezel area or dead space of the display device 10 may be minimized. Accordingly, by disposing the first pad unit PD1 in the display area DA and disposing the flexible film FPCB on the bottom surface of the display device 10, the gap between the plurality of display devices 10 can be further reduced than in a case that a pad unit is disposed on the outermost side of the display panel or in a case that a flexible film is disposed on the side surface of the display panel.

Figure 13:
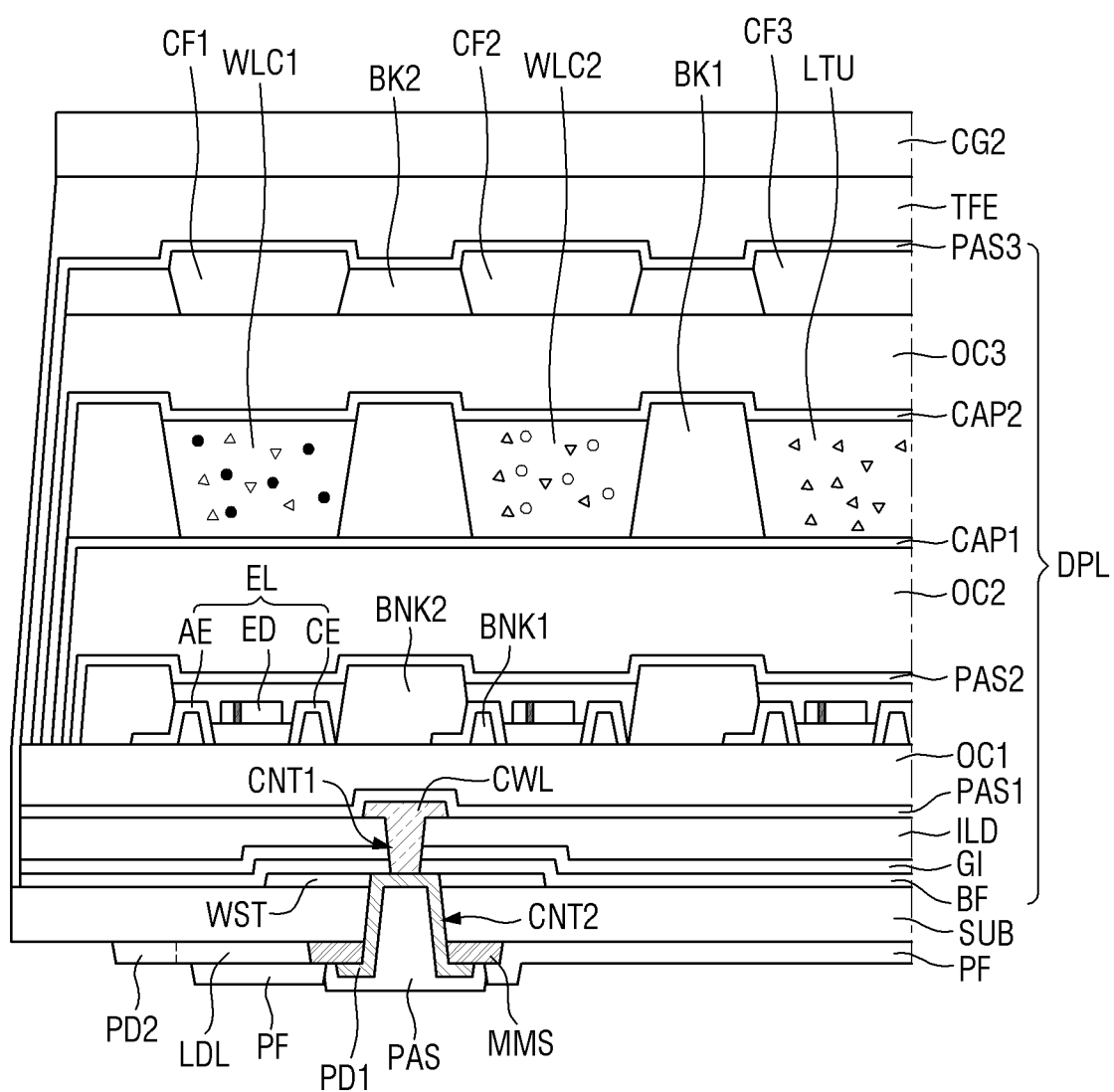

In FIG. 13, the protection part PAS may fill or may be disposed in the depression or a recess of the first pad unit PD1 formed by the stepped portion of the second contact hole CNT2. Optionally, the protection part PAS may cover or overlap a part of the metal pattern MMS or the protective film PF. The protection part PAS may protect the first pad unit PD1 that may not be covered or overlapped by the protective film PF, and may prevent damage to the first pad unit PD1.

For example, the protection part PAS may cover or overlap a plurality of first pad units PD1 on which the protective film PF may not be formed or disposed. The protection part PAS may include functional ink to be selectively coated on a region where the plurality of first pad units PD1 may be provided or disposed. Accordingly, the display device 10 may include the protective film PF covering or overlapping the bottom surface of the substrate SUB and the lead line LDL, and the protection part PAS covering or overlapping the first pad unit PD1, thereby stably protecting the bottom surface of the display device 10.

Figure 14:
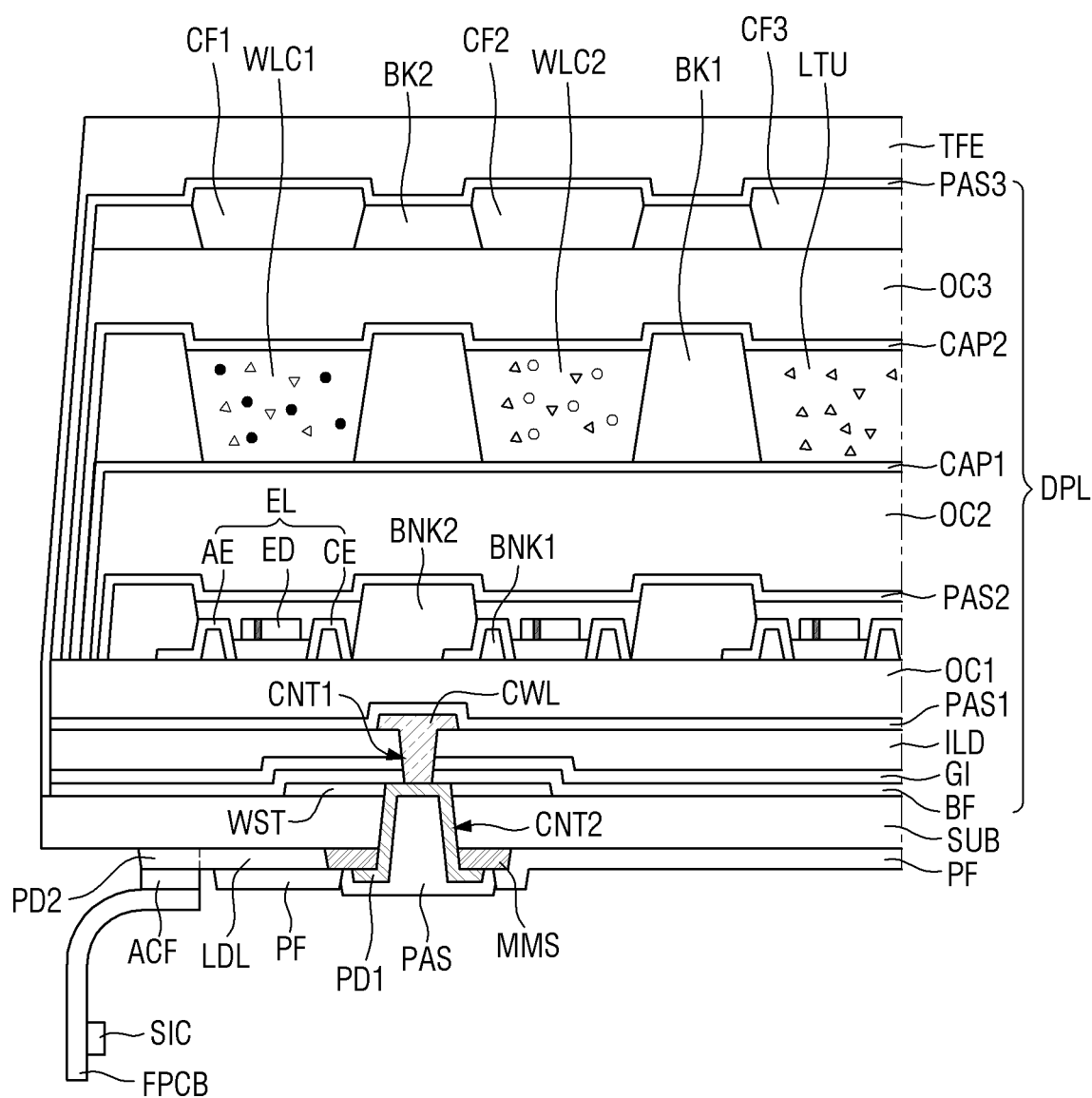

In FIG. 14, the flexible film FPCB may be disposed on the bottom surface of the substrate SUB. One or a side of the flexible film FPCB may be attached to the second pad unit PD2 through the connection film ACF, and the other or another side of the flexible film FPCB may be electrically connected to a source circuit board (not shown) on the bottom surface of the substrate SUB. The flexible film FPCB may transmit a signal from the source driver SIC to the display device 10.

Figure 15:
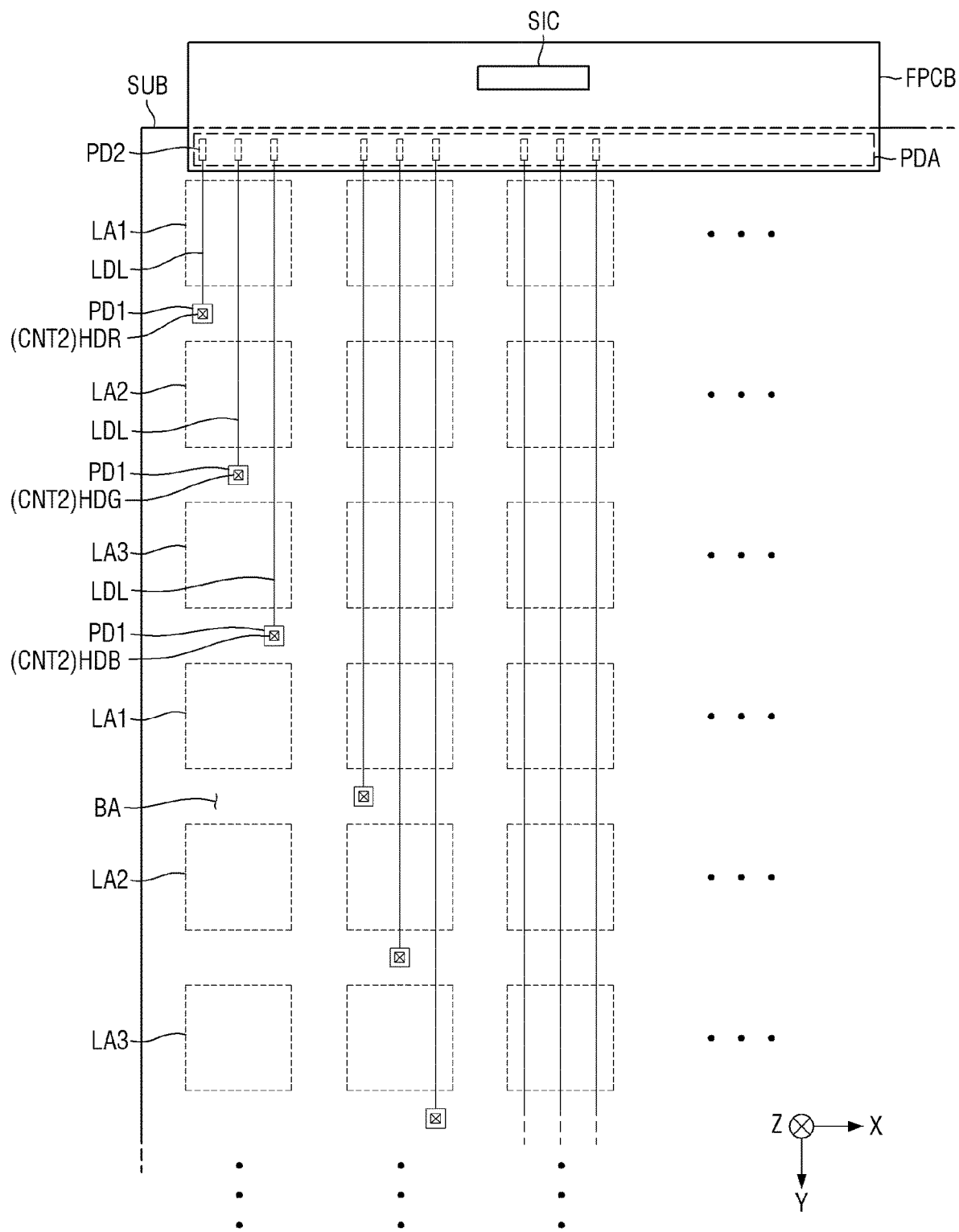
FIG. 15 is a rear view illustrating the display device of FIG. 6.

FIG. 15 is a rear view illustrating the display device of FIG. 6.

Referring to FIG. 15, the first pad unit PD1 may be disposed on the bottom surface of the substrate SUB, and may be electrically connected to the connection line CWL exposed through the second contact hole CNT2. The second contact hole CNT2 and the first pad unit PD1 inserted into the second contact hole CNT2 may be disposed between the plurality of emission areas LA. The second contact hole CNT2 and the first pad unit PD1 may be disposed in the plurality of light blocking areas BA. Since the second contact hole CNT2 and the first pad unit PD1 are disposed between the plurality of emission areas LA of the display area DA, the display device 10 may not include a separate pad unit disposed at the outermost side, and a bezel area or dead space of the display device 10 may be minimized. Accordingly, by disposing the first pad unit PD1 in the display area DA and disposing the flexible film FPCB on the bottom surface of the display device 10, the gap between the plurality of display devices 10 can be further reduced than in a case that a pad unit is disposed on the outermost side of the display panel or in a case that a flexible film is disposed on the side surface of the display panel.

The lead line LDL may be disposed on the bottom surface of the substrate SUB, and may electrically connect the first pad unit PD1 and the second pad unit PD2 to each other. For example, the lead line LDL may be integral with the second pad unit PD2, but is not limited thereto. The lead line LDL may be in direct contact with the metal pattern MIMS, and may be electrically connected to the first pad unit PD1 through the metal pattern MIMS.

For example, the lead line LDL may be formed of a laminated structure of aluminum and copper (Ti/Cu) or a laminated structure of aluminum and titanium (Ti/Al/Ti), but is not limited thereto.

The second pad unit PD2 may be disposed on the bottom surface of the substrate SUB and may be spaced apart from the first pad unit PD1. The second pad unit PD2 may be electrically connected to the first pad unit PD1 through the lead line LDL. The second pad unit PD2 may receive various voltages or signals from the flexible film FPCB, and may supply the corresponding voltages or signals to the first pad unit PD1 and the connection line CWL.

For example, the second pad unit PD2 may be disposed in the display area DA, but is not limited thereto. For another example, the second pad unit PD2 may be disposed in the non-display area NDA as long as it does not increase the distance between the plurality of display devices 10.

The flexible film FPCB may be disposed on the bottom surface of the substrate SUB. One or a side of the flexible film FPCB may be attached to the second pad unit PD2 through the connection film ACF, and the other or another side of the flexible film FPCB may be electrically connected to a source circuit board (not shown) on the bottom surface of the substrate SUB. The flexible film FPCB may transmit a signal from the source driver SIC to the display device 10. For example, the source driver SIC may be an integrated circuit (IC). In response to a source control signal of a timing controller, the source driver SIC may convert digital video data into an analog data voltage, and may supply it to a data line of the display area DA through the flexible film.

A plurality of second contact holes CNT2 may include first to third source contact holes HDR, HDG, and HDB. For example, each of the first to third source contact holes HDR, HDG, and HDB may be disposed on one or a side of each of the first to third emission areas LA1, LA2, and LA3. The first pad unit PD1 inserted into the first source contact hole HDR may supply a data voltage to a pixel corresponding to each of the plurality of first emission areas LA1 disposed in the corresponding column. The first pad unit PD1 inserted into the second source contact hole HDG may supply a data voltage to a pixel corresponding to each of the plurality of second emission areas LA2 disposed in the corresponding column. The first pad unit PD1 inserted into the third source contact hole HDB may supply a data voltage to a pixel corresponding to each of the plurality of third emission areas LA3 disposed in the corresponding column.

For example, the first to third source contact holes HDR, HDG, and HDB may be electrically connected to one data line, and each of the first to third source contact holes HDR, HDG, and HDB may supply a data voltage to pixels arranged or disposed in the same column.

The plurality of second contact holes CNT2 may be disposed in different rows or different columns. The plurality of second contact holes CNT2 may be misaligned. For example, the first to third source contact holes HDR, HDG, and HDB corresponding to the first column may be disposed in first to third rows, and the first to third source contact holes HDR, HDG, and HDB corresponding to the second column may be arranged or disposed in fourth to sixth rows, but are not limited thereto. The arrangement of the plurality of second contact holes CNT2 may be freely changed in design according to the arrangement of the second pad unit PD2 and the lead line LDL.

Figure 16:
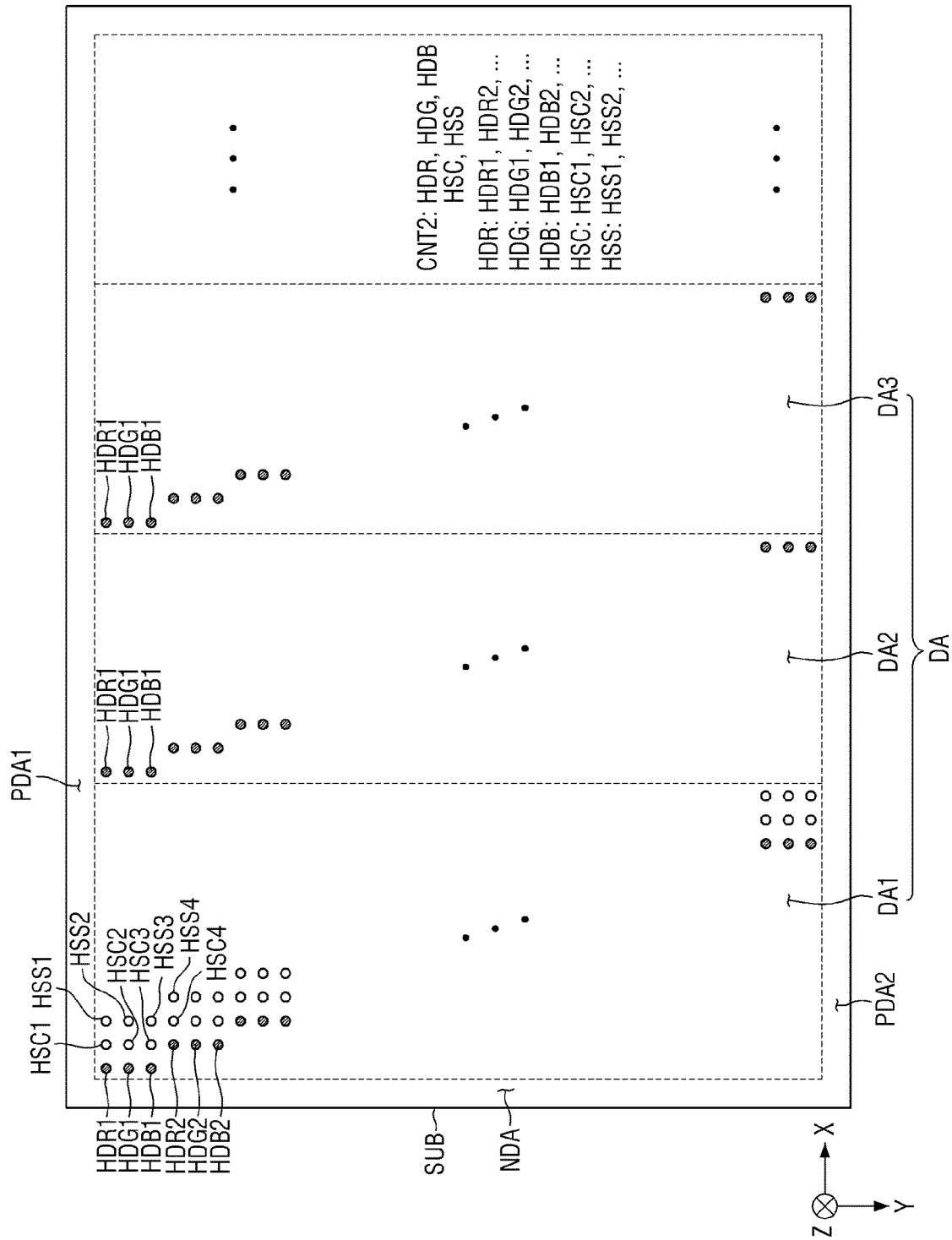
FIG. 16 is a rear view illustrating a plurality of contact holes of a substrate in a display device according to an embodiment.

FIG. 16 is a rear view illustrating a plurality of contact holes of a substrate in a display device according to an embodiment.

Referring to FIG. 16, the display area DA may include first to third display areas DA1, DA2, and DA3. The first to third display areas DA1, DA2, and DA3 may be arranged or disposed along the first direction (X-axis direction). Each of the first to third display areas DA1, DA2, and DA3 may include short sides in the first direction (X-axis direction) and long sides in the second direction (Y-axis direction), but is not limited thereto.

The second contact hole CNT2 and the first pad unit PD1 inserted into the second contact hole CNT2 may be disposed in the display area DA. Since the second contact hole CNT2 and the first pad unit PD1 are disposed between the plurality of emission areas LA of the display area DA, the display device 10 may not include a separate pad unit disposed at the outermost side, and a bezel area or dead space of the display device 10 may be minimized.

Each of first and second pad areas PDA1 and PDA2 may be disposed in the non-display area NDA. The second pad unit PD2 may be disposed in each of the first and second pad areas PDA1 and PDA2, and the flexible film FPCB may be attached onto the second pad unit PD2 in each of the first and second pad areas PDA1 and PDA2.

The plurality of second contact holes CNT2 may include first to third source contact holes HDR, HDG, and HDB, and first and second scan contact holes HSC and HSS.

The first to third source contact holes HDR, HDG, and HDB may be disposed in each of the first to third display areas DA1, DA2, and DA3. For example, the first to third source contact holes HDR, HDG, and HDB may be arranged or disposed along an extension line from the upper left end of each of the first to third display areas DA1, DA2, and DA3 to the lower right end of each of the first to third display areas DA1, DA2, and DA3. The first to third source contact holes HDR, HDG, and HDB may form one source contact hole group to be electrically connected to one data line. A plurality of source contact hole groups may be respectively disposed in different columns and may be electrically connected to different data lines.

The first and second scan contact holes HSC and HSS may be disposed in the first display area DA1 among the first to third display areas DA1, DA2, and DA3. For example, the first and second scan contact holes HSC and HSS may be arranged or disposed along an extension line from the upper left end of the first display area DA1 to the lower right end of the first display area DA1. The first pad unit PD1 inserted into the first scan contact hole HSC may supply a first gate signal to the pixels arranged or disposed in the corresponding row, and the first pad unit PD1 inserted into the second scan contact hole HSS may supply a second gate signal to the pixels arranged or disposed in the corresponding row. The first and second scan contact holes HSC and HSS may form one scan contact hole group, and the plurality of scan contact hole groups may be respectively disposed in different rows.

Figure 17:
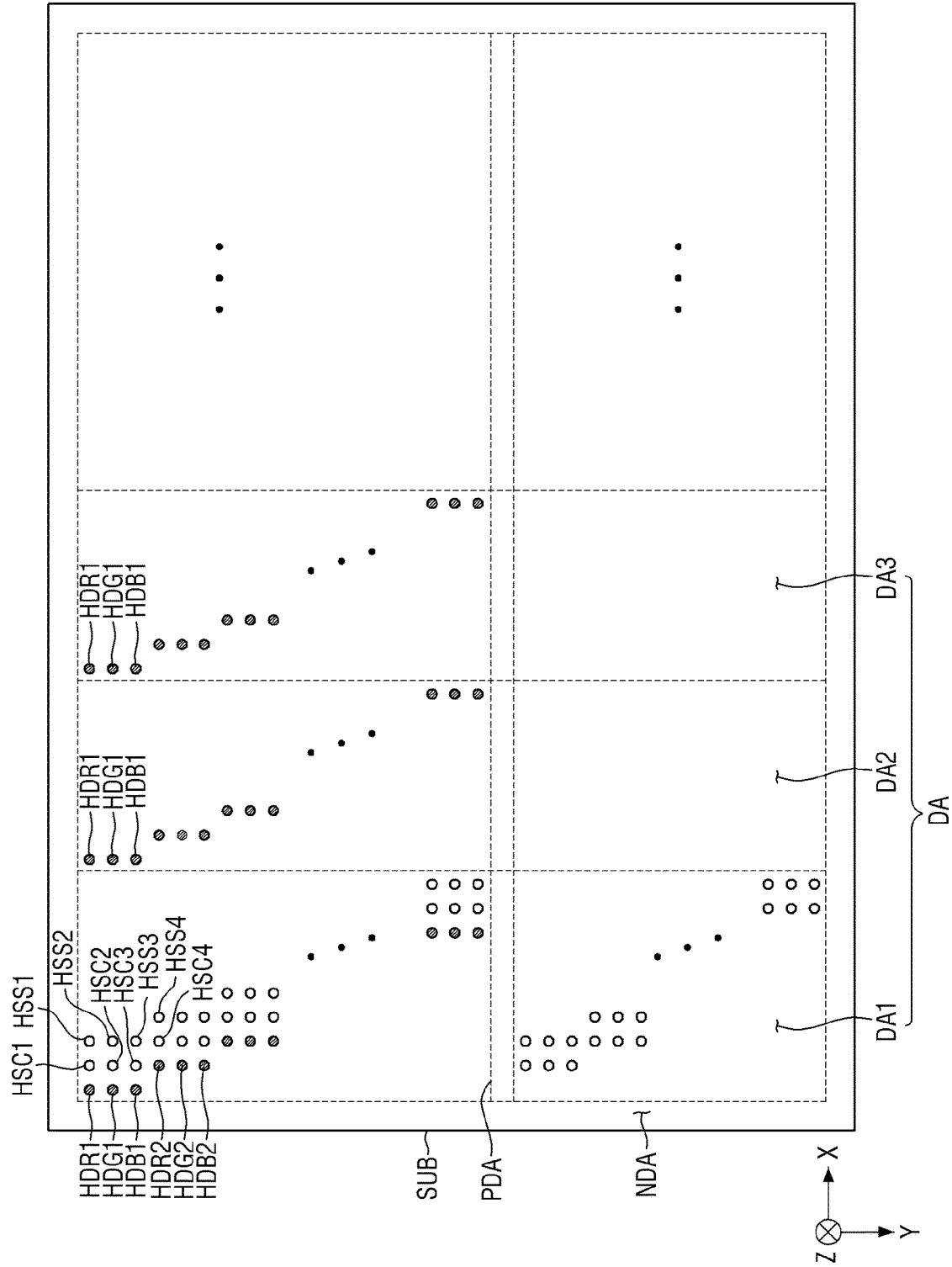
FIG. 17 is a rear view illustrating a plurality of contact holes of a substrate in a display device according to an embodiment.

FIG. 17 is a rear view illustrating a plurality of contact holes of a substrate in a display device according to an embodiment.

Referring to FIG. 17, the display area DA may include first to third display areas DA1, DA2, and DA3. The first to third display areas DA1, DA2, and DA3 may be arranged or disposed along the first direction (X-axis direction). Each of the first to third display areas DA1, DA2, and DA3 may include short sides in the first direction (X-axis direction) and long sides in the second direction (Y-axis direction), but is not limited thereto.

The second contact hole CNT2 and the first pad unit PD1 inserted into the second contact hole CNT2 may be disposed in the display area DA. Since the second contact hole CNT2 and the first pad unit PD1 are disposed between the plurality of emission areas LA of the display area DA, the display device 10 may not include a separate pad unit disposed at the outermost side, and a bezel area or dead space of the display device 10 may be minimized.

A pad area PDA may be disposed on the display area DA. The pad area PDA may extend in the first direction (X-axis direction) and may be disposed in a partial region of the first to third display areas DA1, DA2, and DA3. For example, the pad area PDA may be disposed adjacent to a central portion of each of the first to third display areas DA1, DA2, and DA3, but is not limited thereto. The second pad unit PD2 may be disposed on the pad area PDA, and the flexible film FPCB may be attached onto the second pad unit PD2 in the pad area PDA.

The plurality of second contact holes CNT2 may include first to third source contact holes HDR, HDG, and HDB, and first and second scan contact holes HSC and HSS.

The first to third source contact holes HDR, HDG, and HDB may be disposed in each of the first to third display areas DA1, DA2, and DA3. For example, the first to third source contact holes HDR, HDG, and HDB may be arranged or disposed along an extension line from the upper left end of each of the first to third display areas DA1, DA2, and DA3 to the second pad unit PD2 disposed on the right side of each of the first to third display areas DA1, DA2, and DA3. The first to third source contact holes HDR, HDG, and HDB may be arranged or disposed along an extension line from the upper left end of each of the first to third display areas DA1, DA2, and DA3 to the right side of the pad area PDA in the corresponding display area. The first to third source contact holes HDR, HDG, and HDB may form one source contact hole group to be electrically connected to one data line. Accordingly, each of the plurality of source contact hole groups may be arranged or disposed along a diagonal direction between the first direction (X-axis direction) and the second direction (Y-axis direction) from one or a side of the second pad unit PD2 in the first to third display areas DA1, DA2, and DA3.

The first and second scan contact holes HSC and HSS may be disposed in the first display area DA1 among the first to third display areas DA1, DA2, and DA3. For example, the first and second scan contact holes HSC and HSS may be arranged or disposed along an extension line from the upper left end of the first display area DA1 to the second pad unit PD2 disposed on the right side of the first display area DA1. The first and second scan contact holes HSC and HSS may be disposed along an extension line from the upper left end of the first display area DA1 to the right side of the pad area PDA in the first display area DA1.

For example, the first and second scan contact holes HSC and HSS may be arranged or disposed along an extension line from the second pad unit PD2 disposed on the left side of the first display area DA1 to the lower right end of the first display area DA1. The first and second scan contact holes HSC and HSS may be arranged or disposed along an extension line from the left side of the pad area PDA in the first display area DA1 to the lower right end of the first display area DA1.

The first pad unit PD1 inserted into the first scan contact hole HSC may supply a first gate signal to the pixels arranged or disposed in the corresponding row, and the first pad unit PD1 inserted into the second scan contact hole HSS may supply a second gate signal to the pixels arranged or disposed in the corresponding row. The first and second scan contact holes HSC and HSS may form one scan contact hole group, and the plurality of scan contact hole groups may be respectively disposed in different rows.

Figure 18:
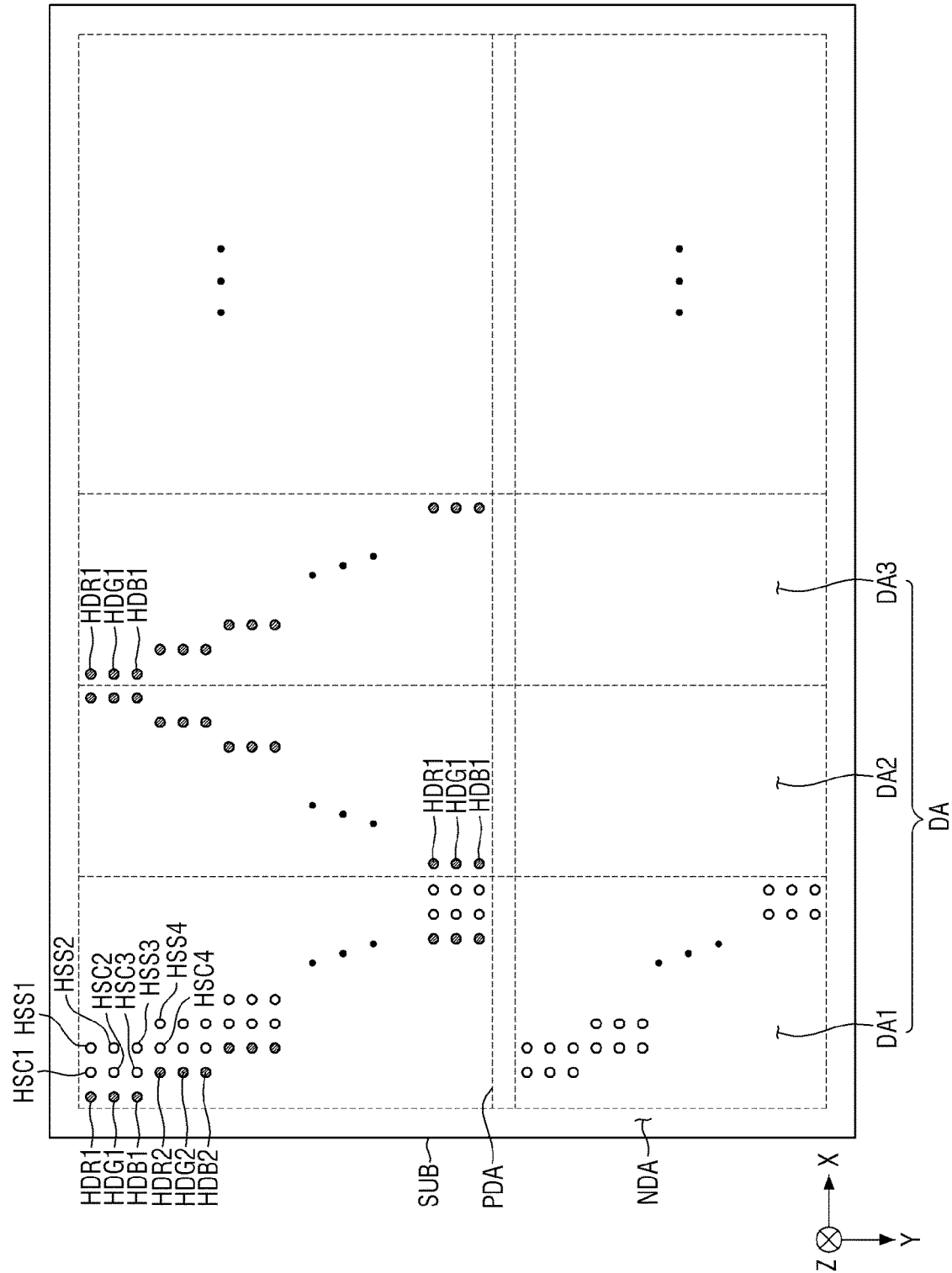
FIG. 18 is a rear view illustrating a plurality of contact holes of a substrate in a display device according to an embodiment.

FIG. 18 is a rear view illustrating a plurality of contact holes of a substrate in a display device according to an embodiment.

Referring to FIG. 18, the display area DA may include first to third display areas DA1, DA2, and DA3. The first to third display areas DA1, DA2, and DA3 may be arranged or disposed along the first direction (X-axis direction). Each of the first to third display areas DA1, DA2, and DA3 may include short sides in the first direction (X-axis direction) and long sides in the second direction (Y-axis direction), but is not limited thereto.

The second contact hole CNT2 and the first pad unit PD1 inserted into the second contact hole CNT2 may be disposed in the display area DA. Since the second contact hole CNT2 and the first pad unit PD1 are disposed between the plurality of emission areas LA of the display area DA, the display device 10 may not include a separate pad unit disposed at the outermost side, and a bezel area or dead space of the display device 10 may be minimized.

A pad area PDA may be disposed on the display area DA. The pad area PDA may extend in the first direction (X-axis direction) and may be disposed in a partial region of the first to third display areas DA1, DA2, and DA3. For example, the pad area PDA may be disposed adjacent to a central portion of each of the first to third display areas DA1, DA2, and DA3, but is not limited thereto. The second pad unit PD2 may be disposed on the pad area PDA, and the flexible film FPCB may be attached onto the second pad unit PD2 in the pad area PDA.

The plurality of second contact holes CNT2 may include the first to third source contact holes HDR, HDG, and HDB, and first and second scan contact holes HSC and HSS.

The first to third source contact holes HDR, HDG, and HDB may be disposed in each of the first to third display areas DA1, DA2, and DA3. For example, the first to third source contact holes HDR, HDG, and HDB may be arranged or disposed along an extension line from the upper left end of the first display area DA1 to the second pad unit PD2 disposed on the right side of the first display area DA1. The first to third source contact holes HDR, HDG, and HDB may be disposed along an extension line from the upper left end of the first display area DA1 to the right side of the pad area PDA in the first display area DA1.

The first to third source contact holes HDR, HDG, and HDB may be arranged or disposed along an extension line from the upper right end of the second display area DA2 to the second pad unit PD2 disposed on the left side of the first display area DA1. The first to third source contact holes HDR, HDG, and HDB may be disposed along an extension line from the upper right end of the first display area DA1 to the left side of the pad area PDA in the first display area DA1.

Accordingly, the first to third source contact holes HDR, HDG, and HDB disposed in the first display area DA1 and the first to third source contact holes HDR, HDG, and HDB disposed in the second display area DA2 may be arranged or disposed symmetrically with respect to an axis in the second direction (Y-axis direction).

The first to third source contact holes HDR, HDG, and HDB may form one source contact hole group to be electrically connected to one data line. Accordingly, each of the plurality of source contact hole groups may be arranged or disposed along a diagonal direction between the first direction (X-axis direction) and the second direction (Y-axis direction) from one or a side of the second pad unit PD2 in the first to third display areas DA1, DA2, and DA3.

The first and second scan contact holes HSC and HSS may be disposed in the first display area DA1 among the first to third display areas DA1, DA2, and DA3. For example, the first and second scan contact holes HSC and HSS may be arranged or disposed along an extension line from the upper left end of the first display area DA1 to the second pad unit PD2 disposed on the right side of the first display area DA1. The first and second scan contact holes HSC and HSS may be disposed along an extension line from the upper left end of the first display area DA1 to the right side of the pad area PDA in the first display area DA1.

For example, the first and second scan contact holes HSC and HSS may be arranged or disposed along an extension line from the second pad unit PD2 disposed on the left side of the first display area DA1 to the lower right end of the first display area DA1. The first and second scan contact holes HSC and HSS may be arranged or disposed along an extension line from the left side of the pad area PDA in the first display area DA1 to the lower right end of the first display area DA1.

The first pad unit PD1 inserted into the first scan contact hole HSC may supply a first gate signal to the pixels arranged or disposed in the corresponding row, and the first pad unit PD1 inserted into the second scan contact hole HSS may supply a second gate signal to the pixels arranged or disposed in the corresponding row. The first and second scan contact holes HSC and HSS may form one scan contact hole group, and the plurality of scan contact hole groups may be respectively disposed in different rows.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the following claims.

What is claimed is:

1. A display device comprising:
   a substrate having an upper surface and a lower surface opposite the upper surface in a thickness direction and including a first contact hole;
   an etching stopper disposed on the upper surface of the substrate and including the first contact hole;
   a metal pattern having an upper surface directly contacting the lower surface of the substrate and having an edge surface surrounding the first contact hole in a plan view;
   a first pad unit having an upper surface directly contacting the edge surface and directly contacting a lower surface of a part of the metal pattern and inserted into the first contact hole;
   a lead line disposed on the lower surface of the substrate and electrically connected to another part of the metal pattern;
   a second pad unit disposed on the lower surface of the substrate and electrically connected to the lead line;
   a protective film overlapping the lower surface of the substrate, the protective film directly contacting the another part of the metal pattern and directly contacting the lead line; and
   a protection part overlapping the first pad unit.

2. The display device of claim 1, further comprising:
   a flexible film disposed on the second pad unit; and
   a source driver that supplies a source voltage to the first pad unit, the source driver being disposed on the flexible film.

3. The display device of claim 1, wherein
   the metal pattern includes a metal oxide having a wet etching resistance, and
   a wet etching rate of the metal pattern is lower than a wet etching rate of the substrate.

4. The display device of claim 1, wherein
the etching stopper includes an inorganic insulating material or an organic insulating material having a wet etching resistance, and
a wet etching rate of the etching stopper is lower than a wet etching rate of the substrate.

5. The display device of claim 1, wherein the first pad unit is formed through a coating process using a metal ink and a heat treatment process.

6. The display device of claim 1, wherein the protection part is disposed in a recess of the first pad unit formed by the first contact hole.

7. The display device of claim 1, further comprising:
a display area including a plurality of pixels; and
a non-display area adjacent to the display area,
wherein the first pad unit is disposed in the display area, and the second pad unit is disposed in the non-display area.

8. The display device of claim 1, further comprising:
a display area including a plurality of pixels; and
a non-display area adjacent to the display area,
wherein the first pad unit and the second pad unit are disposed in the display area.

9. The display device of claim 1, further comprising:
a thin film transistor layer disposed on the etching stopper, the thin film transistor layer comprising a plurality of insulating layers and a thin film transistor; and
a connection line electrically connected to the first pad unit through a second contact hole connected to the first contact hole, the connection line being disposed on a part of the plurality of insulating layers of the thin film transistor layer.

10. The display device of claim 9, wherein
the plurality of insulating layers of the thin film transistor layer comprise:
a gate insulating layer disposed on the etching stopper;
an interlayer insulating layer disposed on the gate insulating layer; and
a passivation layer disposed on the interlayer insulating layer,
the connection line is disposed on the interlayer insulating layer, and
the second contact hole passes through the interlayer insulating layer and the gate insulating layer.

11. The display device of claim 9, wherein
the connection line supplies a data voltage to the thin film transistor layer.

12. The display device of claim 9, wherein
the connection line supplies a gate signal to the thin film transistor layer.

13. The display device of claim 1, further comprising:
a plurality of display areas each including a plurality of pixels; and
a non-display area adjacent to the plurality of display areas, wherein
the substrate includes a plurality of first contact holes, and
the plurality of first contact holes are disposed along an extension line from an upper end of a side of each of the plurality of display areas to a lower end of another side of each of the plurality of display areas.

14. The display device of claim 1, further comprising:
a plurality of display areas each including a plurality of pixels; and
a non-display area adjacent to the plurality of display areas, wherein
the substrate includes a plurality of first contact holes,
the second pad unit is disposed on a part of each of the plurality of display areas, and
the plurality of first contact holes are disposed along an extension line from an upper end of a side of each of the plurality of display areas to a corresponding second pad unit disposed on another side of each of the plurality of display areas.

15. The display device of claim 1, further comprising:
a plurality of display areas each including a plurality of pixels; and
a non-display area adjacent to the plurality of display areas, wherein
the substrate includes a plurality of first contact holes,
the second pad unit is disposed on a part of each of the plurality of display areas,
a number of the plurality of first contact holes are disposed along an extension line from an upper end of a side of each of the plurality of display areas to a corresponding second pad unit disposed on another side of each of the plurality of display areas, and
a number of other first contact holes are disposed along an extension line from an upper end of the another side of each of the plurality of display areas to a corresponding second pad unit disposed on a side of each of the plurality of display areas.

16. A tiled display device comprising:
a plurality of display devices, each of the plurality of display devices including:
a display area having a plurality of pixels; and
a non-display area adjacent to the display area; and
a coupling member that connects the plurality of display devices, wherein
each of the plurality of display devices comprises:
a substrate having an upper surface and a lower surface opposite the upper surface in a thickness direction and including a first contact hole;
an etching stopper disposed on the upper surface of the substrate and including the first contact hole;
a metal pattern having an upper surface directly contacting the lower surface of the substrate and having an edge surface surrounding the first contact hole in a plan view;
a first pad unit having an upper surface directly contacting the edge surface and directly contacting a lower surface of a part of the metal pattern and inserted into the first contact hole;
a protective film overlapping the lower surface of the substrate, the protective film directly contacting an another part of the metal pattern; and
a protection part overlapping the first pad unit.

17. The tiled display device of claim 16, wherein each of the plurality of display devices further comprises:
a lead line disposed on the another surface of the substrate and directly contacting the protective film and electrically connected to the another part of the metal pattern; and
a second pad unit disposed on the another surface of the substrate and electrically connected to the lead line.

18. The tiled display device of claim 16, wherein
the metal pattern includes a metal oxide having a wet etching resistance, and
a wet etching rate of the metal pattern is lower than a wet etching rate of the substrate.

19. The tiled display device of claim 16, wherein the first pad unit is formed through a coating process using a metal ink and a heat treatment process.

20. The tiled display device of claim 16, wherein the protection part is disposed in a recess of the first pad unit formed by the first contact hole.

21. The display device of claim 1, wherein the lead line is disposed directly on the lower surface of the substrate.

22. The display device of claim 1, wherein
the first pad unit comprises a portion inserted into the contact hole, and first and second ends extending parallel to and under the substrate and the metal pattern in the thickness direction and directly contacting the lower surface of the part of the metal pattern, and
the protection part extending beyond the first and second ends of the first pad unit.

23. The display device of claim 22, wherein the protection part directly contacts the first and second ends and the portion of the first pad unit.

24. The display device of claim 1, wherein the lead line is spaced apart from the first contact hole and the first pad unit by the another part of the metal pattern.

\* \* \* \* \*